United States Patent [19]

Yamamoto et al.

[11] Patent Number: 5,936,985
[45] Date of Patent: Aug. 10, 1999

[54] METHOD FOR STABILIZING OUTPUT OF HIGHER HARMONIC WAVES AND SHORT WAVELENGTH LASER BEAM SOURCE USING THE SAME

[75] Inventors: Kazuhisa Yamamoto, Takatsuki; Yasuo Kitaoka, Kawachinagano; Kiminori Mizuuchi, Neyagawa; Makoto Kato, Nishinomiya, all of Japan

[73] Assignee: Matsushita Electric Industrial Co., Ltd., Osaka, Japan

[21] Appl. No.: 08/527,411

[22] Filed: Sep. 13, 1995

[30] Foreign Application Priority Data

| Sep. 14, 1994 | [JP] | Japan | 6-220133 |
| Nov. 4, 1994 | [JP] | Japan | 6-271282 |
| Dec. 2, 1994 | [JP] | Japan | 6-299476 |

[51] Int. Cl.$^6$ ........................................ H01S 3/00
[52] U.S. Cl. .................................. 372/38; 372/22
[58] Field of Search .................... 372/22, 38, 32, 372/96

[56] References Cited

U.S. PATENT DOCUMENTS

| 4,995,048 | 2/1991 | Kuindersma et al. . | |
| 5,299,212 | 3/1994 | Koch et al. . | |
| 5,325,382 | 6/1994 | Emura et al. | 372/96 |
| 5,384,797 | 1/1995 | Welch et al. | 372/22 |
| 5,619,369 | 4/1997 | Yamamoto et al. | 372/22 |

FOREIGN PATENT DOCUMENTS

| 411131 | 2/1991 | European Pat. Off. . |
| 529732 | 3/1993 | European Pat. Off. . |
| 576197 | 12/1993 | European Pat. Off. . |
| 585758 | 3/1994 | European Pat. Off. . |
| 3091276 | 4/1991 | Japan . |
| 4324304 | 11/1992 | Japan . |
| 5066440 | 3/1993 | Japan . |

OTHER PUBLICATIONS

Kuzuhisa Yamamoto & Kiminori Mizuuchi, "Blue–Light Generation by Frequency Doubling of a Laser Diode in a Periodically Domain–Inverted LiTaO$_3$ Waveguide", IEEE Photonics Tech. Ltrs., Vol. 4, No. 5, May 1992.

C. Zimmerman et al., "Second Harmonic Generation at 972 nm Using a Distributed Bragg Reflection Semiconductor Laser", Applied Physics Letters, vol. 61, No. 23, pp. 2741–2743, Dec., 7, 1992.

*Primary Examiner*—Rodney Bovernick
*Assistant Examiner*—Robert E. Wise
*Attorney, Agent, or Firm*—Ratner & Prestia

[57] ABSTRACT

A laser beam as fundamental waves which is emitted from a distribution Bragg reflection (DBR) semiconductor laser is incident on an optical waveguide of a light wavelength conversion device in which domain-inverted regions and the optical waveguide are formed in an LiTaO$_3$ substrate. The wavelength of the incident laser beam is then converted so as to obtain higher harmonic waves such as blue light. In the conversion, a drive current to be applied to a DBR portion of the DBR semiconductor laser is changed so as to change an oscillating wavelength of the DBR semiconductor laser, thereby matching the oscillating wavelength with a phase-matched wavelength of the light wavelength conversion device. Thus, the generation of the harmonic waves to be output is stably controlled.

32 Claims, 24 Drawing Sheets

FIG. 24A
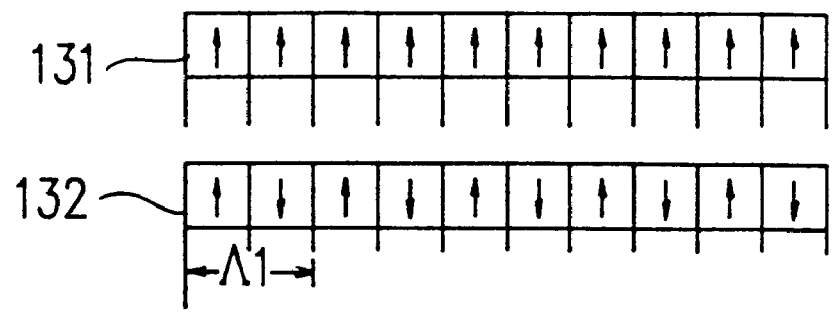
FI. 24B
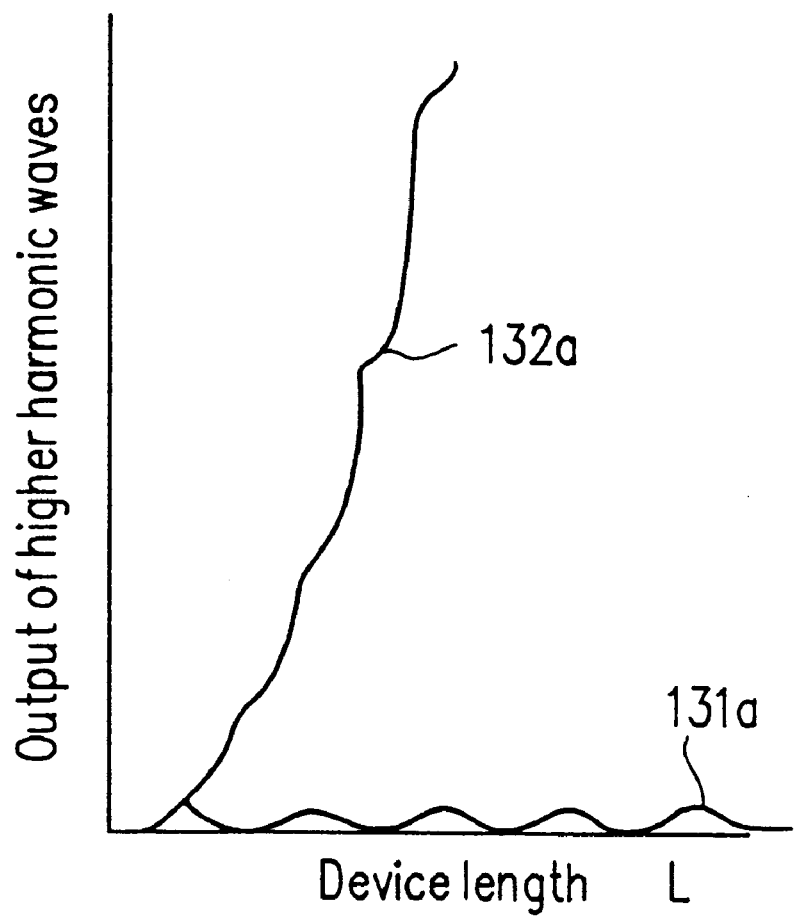

METHOD FOR STABILIZING OUTPUT OF HIGHER HARMONIC WAVES AND SHORT WAVELENGTH LASER BEAM SOURCE USING THE SAME

BACKGROUND OF THE INVENTION

1. Field of the Invention

The present invention relates to a method for stabilizing an output of higher harmonic waves used in the fields of optical information processing, optical application measurement control, and the like utilizing coherent light, and a short wavelength laser beam source using the method.

2. Description of the Related Art

In the field of optical information processing, short wavelength laser beam sources for optical recording require an output of several mW or more. As blue laser beam sources, the combination of a semiconductor laser emitting fundamental waves and a light wavelength conversion device generating higher harmonic waves of the fundamental waves is promising.

FIG. 22 is a cross-sectional view showing a structure of a conventional short wavelength laser beam source 5000 emitting blue light. Fundamental waves P1 emitted by a semiconductor laser 121 are collimated by a collimator lens 124 and focused onto an optical waveguide 102 formed inside of a light wavelength conversion device 122 by a focus lens 125. The fundamental waves P1 are converted into higher harmonic waves P2 in the optical waveguide 102 and output. Each component of the short wavelength laser beam source 5000 is mounted on a base member 120 made of Al. The light wavelength conversion device 122 is positioned on a quartz plate 123 with its face having the optical waveguide 102 down.

Next, the light wavelength conversion device 122 used in the conventional short wavelength laser beam source 5000 will be described.

FIG. 23A is a perspective view of the conventional light wavelength conversion device 122; FIG. 23B is a cross-sectional view taken along a line 23B–23B of FIG. 23A. Hereinafter, the operation of the light wavelength conversion device 122 will be described by illustrating the generation of higher harmonic waves (wavelength: 437 nm) from fundamental waves (wavelength: 873 nm) (see K. Yamamoto and K. Mizuuchi, "Blue light generation by frequency doubling of a laser diode in a periodically-domain inverted LiTaO$_3$ waveguide", IEEE Photonics Technology Letters, Vol. 4, No. 5, pp. 435–437, 1992).

As shown in FIGS. 23A and 23B, the light wavelength conversion device 122 includes the optical waveguide 102 formed in a LiTaO$_3$ substrate 101. The optical waveguide 102 is provided with periodically domain-inverted layers (domain-inverted regions) 103. The mismatch in propagation constant between the fundamental waves P1 and the higher harmonic waves P2 to be generated is compensated by a periodic structure composed of the domain-inverted regions 103 and non-domain-inverted regions 104. This allows the fundamental waves P1 to be converted into the higher harmonic waves P2 at high efficiency so as to be output. The arrows in FIG. 23B represents the direction of a domain in each region.

Next, the principle of amplification of the higher harmonic waves in the light wavelength conversion device 122 will be described with reference to FIGS. 24A and 24B.

FIG. 24A schematically shows inner structures, namely, the direction of domains of a device 131 which have no domain-inverted regions and of a device 132 which has domain-inverted regions. The arrows in FIG. 24A represent the direction of a domain in each region.

In the device 131, domain-inverted regions are not formed and the directions of domains are aligned in one direction. When fundamental waves pass through the device 131, the waves are partially converted into higher harmonic waves. However, in the structure of the device 131, an output of higher harmonic waves 131a merely repeats increasing and decreasing along the passing direction of the optical waveguide, as shown in FIG. 24B.

On the other hand, in the device 132 which has first-order periodically domain-inverted regions, an output of higher harmonic waves 132a increases in proportion to the square of length L of the optical wavelength as shown in FIG. 24B. It should be noted that only when a quasi-phase match is established, the output of the higher harmonic waves P2 can be obtained from the incident fundamental waves P1 in the domain-inverted structure. The quasi-phase match is established only when a period Λ1 of the domain-inverted region is identical with $\lambda/(2(N2\omega-N\omega))$, where N$\omega$ is an effective refractive index of the fundamental waves (wavelength: $\lambda$), and N2$\omega$ is an effective refractive index of the higher harmonic waves (wavelength: $\lambda/2$).

A method for producing a conventional light wavelength conversion device 5000 having the above-mentioned domain-inverted structure as a fundamental structure component will be described.

First, a periodic Ta film pattern with a width of several $\mu$m is formed on the LiTaO$_3$ substrate 101 made of non-linear optical crystal by vapor deposition and photolithography. The Ta film pattern is subjected to a proton-exchange treatment at 260° C., followed by being heat treated at around 550° C. Thus, the domain-inverted regions 103 are formed in the LiTaO$_3$ substrate 101. Then, a Ta film slit is formed on the LiTaO$_3$ substrate 101, heat treated in pyrophosphoric acid at 260° C. for 12 minutes, and subjected to an anneal treatment at 420° C. for one minute. Thus, the optical waveguide 102 is formed.

When the optical waveguide 102 has a length of 10 mm and the fundamental waves P1 having a power of 37 mW with respect to a wavelength of 873 nm is input to the light wavelength conversion device 122 produced as described above, higher harmonic waves P2 having a power of 1.1 mW can be output.

However, allowable width of the light wavelength conversion device 122 with respect to the wavelength of the fundamental waves is generally as small as 0.1 nm. For this reason, the light wavelength conversion device 122 cannot allow mode hopping of a semiconductor laser and spreading of the wavelength of output light.

For example, in the conventional light wavelength conversion device 122 having the above-mentioned domain-inverted regions, the allowance with respect to the wavelength fluctuation of a fundamental wave laser beam at a device length of 10 mm is very narrow; typically, an allowable wavelength half value width of around 0.1 nm. The allowable change with respect to temperature is typically as small as 3° C. Because of this, when a light wavelength conversion device is combined with a semiconductor laser, the following problems arise: The output of the semiconductor laser is likely to be affected by the change in temperature and consequently wavelength fluctuation occurs in output light; as a result, fundamental waves are not converted into higher harmonic waves or the output of higher harmonic waves converted from fundamental waves greatly fluctuates.

The above-mentioned problems will be described in detail below.

Typically, when the wavelength of a semiconductor laser shifts by only 0.05 nm, the output of higher harmonic waves to be obtained becomes half of an intended value. The allowability with respect to the change in wavelength of a semiconductor laser is small. For example, when the ambient temperature during the operation of a semiconductor laser shifts from 20° C. to 21° C., the vertical mode of the semiconductor laser shifts by one and the oscillation wavelength shifts from 820.0 nm to 820.2 nm. Because of this, the output of higher harmonic waves becomes zero.

Regarding the allowable width of the light wavelength conversion device 122 with respect to the change in temperature, when the ambient temperature changes, the output of higher harmonic waves cannot be obtained even if the oscillating wavelength of the semiconductor laser is stable. Furthermore, frequent occurrence of mode hopping causes noise leading to problems in reading from optical disks.

SUMMARY OF THE INVENTION

According to one aspect of the present invention, a method for stabilizing an output of higher harmonic waves includes the steps of: converting fundamental waves, emitted from a distribution Bragg reflection (DBR) semiconductor laser having a wavelength variable portion, into higher harmonic waves in a light wavelength conversion device; and controlling a current to be applied to the wavelength variable portion of the DBR semiconductor laser to change an oscillating wavelength of the DBR semiconductor laser, thereby matching the oscillating wavelength with a peak of the higher harmonic waves.

Alternatively, a method for stabilizing an output of higher harmonic waves of the present invention includes the steps of: converting fundamental waves emitted from a semiconductor laser into higher harmonic waves in a light wavelength conversion device; applying an optical feed-back to the semiconductor laser to set an oscillating wavelength of the semiconductor laser at a predetermined value; and controlling a drive current of the semiconductor laser to change the oscillating wavelength, thereby matching the oscillating wavelength with a peak of the higher harmonic waves.

Alternatively, a method for stabilizing an output of higher harmonic waves of the present invention includes the steps of: converting fundamental waves, emitted from a DBR semiconductor laser having a first wavelength variable portion and a second wavelength variable portion, into higher harmonic waves in a light wavelength conversion device; and coarse-controlling an oscillating wavelength of the DBR semiconductor laser by the first wavelength variable portion and fine-controlling the oscillating wavelength by the second wavelength variable portion, thereby matching the oscillating wavelength with a peak of the higher harmonic waves.

Alternatively, a method for stabilizing an output of higher harmonic waves of the present invention includes the steps of: converting fundamental waves emitted from a DBR semiconductor laser having a wavelength variable portion into higher harmonic waves in a light wavelength conversion device; and performing differential detection of the output of the higher harmonic waves, controlling a current to be applied to the wavelength variable portion of the DBR semiconductor laser by using a detection result to change an oscillating wavelength of the DBR semiconductor laser, thereby matching the oscillating wavelength with a peak of the higher harmonic waves.

Alternatively, a method for stabilizing an output of higher harmonic waves of the present invention includes the steps of: converting fundamental waves emitted from a wavelength-locked semiconductor laser into higher harmonic waves in a light wavelength conversion device having an allowable wavelength half value width wider than an oscillating vertical mode interval of the semiconductor laser; and controlling a current to be applied to the semiconductor laser to change an oscillating wavelength of the semiconductor laser, thereby matching the oscillating wavelength with a peak of the higher harmonic waves.

In one embodiment of the present invention, the light wavelength conversion device is an optical waveguide type.

In another embodiment of the present invention, the optical wavelength conversion device is a bulk type.

In still another embodiment of the present invention, an output of the fundamental waves is monitored to control the current.

In still another embodiment of the present invention, a reflector is further provided between a cleavage face of the semiconductor laser and a DBR portion so that a vertical mode interval is set to be 1 nm or larger.

In still another embodiment of the present invention, the wavelength variable portion or first wavelength variable portion in the DBR semiconductor laser is positioned on a side far away from the light wavelength conversion device.

In still another embodiment of the present invention, the DBR semiconductor laser or the semiconductor laser as well as the light wavelength conversion device are mounted on a base member, an active layer of the DBR semiconductor laser and an optical waveguide of the light wavelength conversion device are respectively positioned on a side far away from the base member.

According to another aspect of the present invention, a short wavelength laser beam source includes: a light wavelength conversion device having periodically domain-inverted regions formed in non-linear optical crystal; and a DBR semiconductor laser, wherein the DBR semiconductor laser has a wavelength variable portion, fundamental waves emitted from the DBR semiconductor laser are converted into higher harmonic waves in the light wavelength conversion device, and an oscillating wavelength of the DBR semiconductor laser is changed so as to match with a peak of the higher harmonic waves by controlling a current to be applied to the wavelength variable portion of the DBR semiconductor laser, whereby a constant output of the higher harmonic waves is obtained.

Alternatively, a short wavelength laser beam source of the present invention includes: a light wavelength conversion device having periodically domain-inverted regions formed in non-linear optical crystal; and a DBR semiconductor laser, wherein fundamental waves emitted from the DBR semiconductor laser are converted into higher harmonic waves in the light wavelength conversion device.

Alternatively, a short wavelength laser beam source of the present invention includes: a light wavelength conversion device having periodically domain-inverted regions formed in non-linear optical crystal; and a semiconductor laser, wherein fundamental waves emitted from the semiconductor laser are converted into higher harmonic waves in the light wavelength conversion device, and an oscillating wavelength of the semiconductor laser set at a predetermined value by optical feedback is changed by controlling a drive current of the semiconductor laser, thereby matching the oscillating wavelength with a peak of the higher harmonic waves to obtain a constant output of the higher harmonic waves.

Alternatively, a short wavelength laser beam source of the present invention includes: a light wavelength conversion device having periodically domain-inverted regions formed in non-linear optical crystal; and a DBR semiconductor laser having first wavelength variable portion and second wavelength variable portion, wherein fundamental waves emitted from the DBR semiconductor laser are converted into higher harmonic waves in the light wavelength conversion device, the first wavelength variable portion coarse-controls an oscillating wavelength of the DBR semiconductor laser, and the second wavelength variable portion fine-controls the oscillating wavelength, whereby the oscillating wavelength is matched with a peak of the higher harmonic waves to obtain a constant output of the higher harmonic waves.

Alternatively, a short wavelength laser beam source of the present invention includes: a DBR semiconductor laser having first wavelength variable portion; and a light wavelength conversion device having second variable portion and periodically domain-inverted regions formed in non-linear optical crystal, wherein fundamental waves emitted from the DBR semiconductor laser are converted into higher harmonic waves in the light wavelength conversion device, the first wavelength variable portion coarse-controls an oscillating wavelength of the DBR semiconductor laser, and the second wavelength variable portion fine-controls a phase-matched wavelength of the light wavelength conversion device, whereby the oscillating wavelength is matched with a peak of the higher harmonic waves to obtain a constant output of the higher harmonic waves.

Alternatively, a short wavelength laser beam source of the present invention includes: a wavelength-locked semiconductor laser; and a light wavelength conversion device having an allowable wavelength half value width wider than an oscillating vertical mode interval of the semiconductor laser, wherein fundamental waves emitted from the semiconductor laser are converted into higher harmonic waves in the light wavelength conversion device, and an oscillating wavelength of the semiconductor laser is changed by controlling a current to be applied to the semiconductor laser so as to match with a peak of the higher harmonic waves, whereby a constant output of the higher harmonic waves is obtained.

Alternatively, a short wavelength laser beam source of the present invention includes: a light wavelength conversion device having periodically domain-inverted regions formed in non-linear optical crystal; and a DBR semiconductor laser having a wavelength variable portion, wherein a reflector is provided outside the DBR semiconductor laser and a laser oscillation is generated between the reflector and the DBR semiconductor laser, fundamental waves emitted from the DBR semiconductor laser are converted into higher harmonic waves in the light wavelength conversion device, and an oscillating wavelength of the DBR semiconductor laser is changed by controlling a current to be applied to the wavelength variable portion of the semiconductor laser so as to match the oscillating wavelength with a peak of the higher harmonic waves, whereby a constant output of the higher harmonic waves is obtained.

Alternatively, a short wavelength laser beam source of the present invention includes: a light wavelength conversion device having at least three periodically domain-inverted regions formed in non-linear optical crystal; and a semiconductor laser, wherein the at least three periodically domain-inverted regions have a first periodically domain-inverted region having a period of $\Lambda$, a second periodically domain-inverted region having a period of $\Lambda 1$, and a third periodically domain-inverted region having a period of $\Lambda 2$, the relationship between the periods is $\Lambda 1 < \Lambda < \Lambda 2$, and higher harmonic waves generated in the second periodically domain-inverted region having a period of $\Lambda 1$ and higher harmonic waves generated in the third periodically domain-inverted region having a period of $\Lambda 2$ are detected by different detectors, respectively.

In one embodiment of the present invention, the light wavelength conversion device is an optical waveguide type. Preferably, the optical waveguide is a proton-exchanged optical waveguide.

In another embodiment of the present invention, the light wavelength conversion device is a bulk type.

In still another embodiment of the present invention, the non-linear optical crystal is $LiNb_xTa_{1-x}O_3$ ($0 \leq X \leq 1$).

In still another embodiment of the present invention, the above-mentioned short wavelength laser beam source further includes a detector and a beam splitter.

In still another embodiment of the present invention, an output of the fundamental waves is monitored to control the current.

In still another embodiment of the present invention, a reflector is further provided between a cleavage face of the semiconductor laser and a DBR portion so that a vertical mode interval is set to be 1 nm or larger.

In still another embodiment of the present invention, a reflector is further provided on either of an incident face or an output face of the light wavelength conversion device.

In still another embodiment of the present invention, reflected return light of the fundamental waves in the light wavelength device is 0.2% or less.

In still another embodiment of the present invention, the DBR semiconductor laser is RF-driven.

In still another embodiment of the present invention, temperature of the semiconductor laser is controlled on a first face of a Peltier device, temperature of the light wavelength conversion device is controlled on a second face of the Peltier device, and change in temperature of the first face is opposite to change in temperature of the second face.

In still another embodiment of the present invention, a wavelength of the fundamental waves is shifted from a phase-matched wavelength of the light wavelength conversion device to modulate an output of the higher harmonic waves.

In still another embodiment of the present invention, a wavelength of the fundamental waves is matched with a phase-matched wavelength of the light wavelength conversion device, and thereafter, a drive current of the semiconductor laser is regulated so as to regulate the output of the higher harmonic waves.

In still another embodiment of the present invention, the wavelength variable portion or the first wavelength variable portion in the DBR semiconductor laser is positioned on a side far away from the light wavelength conversion device.

In still another embodiment of the present invention, the DBR semiconductor laser or the semiconductor laser as well as the light wavelength conversion device are mounted on a base member, an active layer of the DBR semiconductor laser and an optical waveguide of the light wavelength conversion device are respectively positioned on a side far away from the base member.

Thus, the invention described herein makes possible the advantages of (1) providing a method for stabilizing an output of higher harmonic waves enabling the stable output of higher harmonic waves to be obtained irrespective of ambient temperature and (2) providing a short wavelength laser beam source using the same.

These and other advantages of the present invention will become apparent to those skilled in the art upon reading and understanding the following detailed description with reference to the accompanying figures.

BRIEF DESCRIPTION OF THE DRAWINGS

FIGS. 24A and 24B are views illustrating the principle of wavelength conversion by the light wavelength conversion device.

DESCRIPTION OF THE PREFERRED EMBODIMENTS

Embodiment 1

Figure 1:
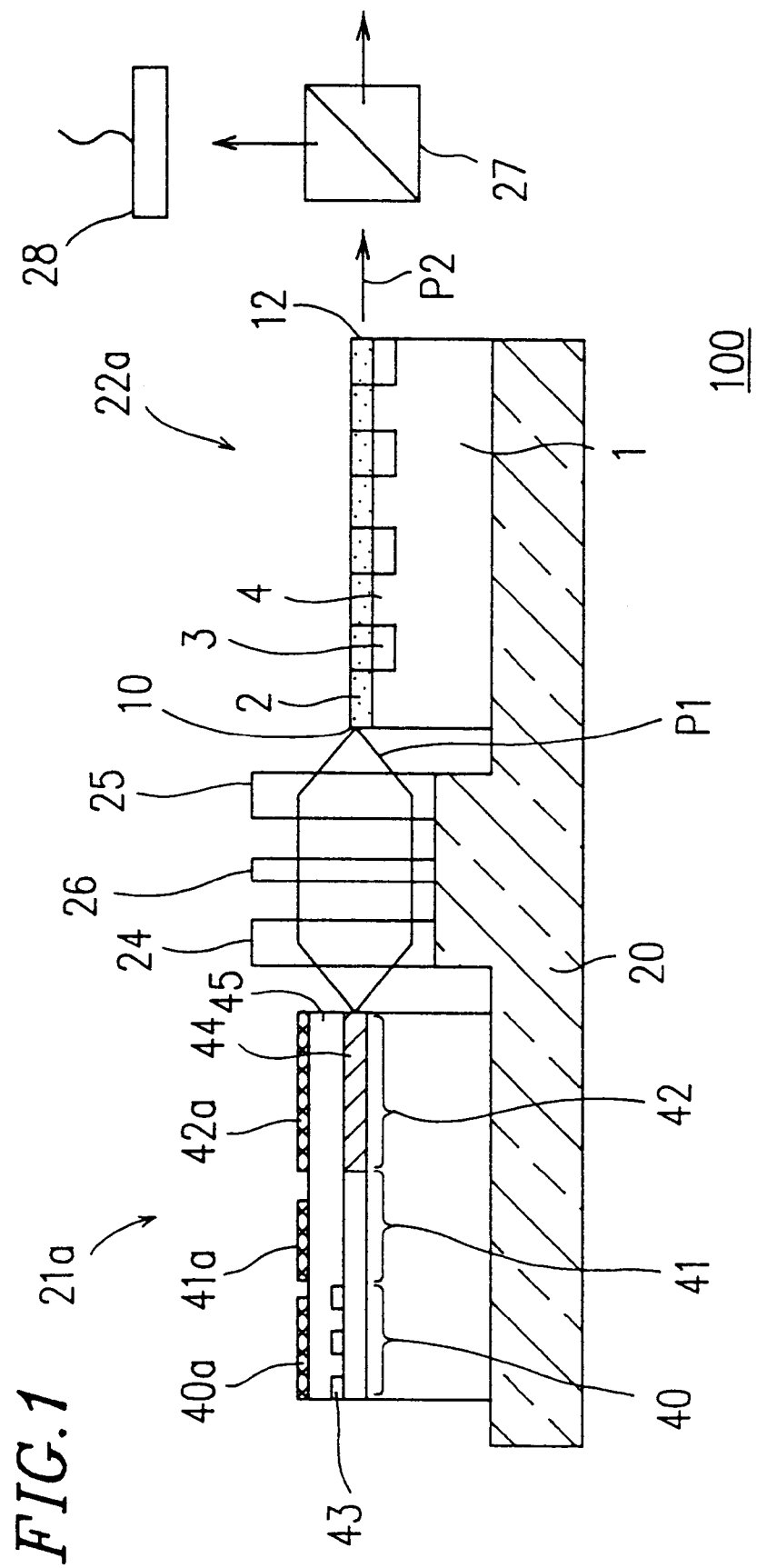
FIG. 1 is a cross-sectional view showing a structure of a short wavelength laser beam source in Embodiment 1 of the present invention.

FIG. 1 is a cross-sectional view showing a structure of a short wavelength laser beam source 100 in Embodiment 1 of the present invention.

The short wavelength laser beam source 100 includes a light wavelength conversion device 22a in which periodically domain-inverted regions 3 are formed on the surface of a substrate 1 made of non-linear optical crystal, $LiTaO_3$. Furthermore, an optical waveguide 2 is formed by proton exchange on the surface of the light wavelength conversion device 22a on which the periodically domain-inverted regions 3 are formed.

The short wavelength laser beam source 100 also includes a distribution Bragg reflection type semiconductor laser (hereinafter referred to as DBR semiconductor laser) 21a having a wavelength variable portion. The DBR semiconductor laser 21a and the light wavelength conversion device 22a are fixed on a base member 20 made of Al. Fundamental waves P1 emitted from the semiconductor laser 21a are collimated by a collimator lens 24 pass through a semi-wavelength plate 26, are focused by a focus lens 25, and are incident upon the optical waveguide 2 of the light wavelength conversion device 22a through an incident face 10. The semi-wavelength plate 26 is inserted so as to rotate the polarization direction of the fundamental waves P1 by 90° and match it with the polarization direction of the optical waveguide 2.

The fundamental waves P1 incident upon the optical waveguide 2 are converted into higher harmonic waves P2 in the domain-inverted region 3 having a phase-matched length L. Then, the power of the higher harmonic waves P2 is amplified in the subsequent non-domain-inverted region 4 also having a phase-matched length L. The higher harmonic waves P2 thus amplified in the optical waveguide 2 are output from an output face 12.

The wavelength at which the higher harmonic waves are generated (phase-matched wavelength) is determined by quasi-phase match based on the refractive index of nonlinear optical crystal and the period of the domain-inverted regions 3. Because of this, the change in ambient temperature causes the change in the refractive index of the non-linear optical crystal; as a result, the phase-matched wavelength changes.

Next, the DBR semiconductor laser 21a will be described.

The DBR semiconductor laser 21a includes a light-emitting portion 42, a phase control portion 41, and a DBR portion 40. The light-emitting portion 42, the phase control portion 41, and the DBR portion 40 can be independently controlled by electrodes 42a, 41a, and 40a, respectively. When a current is injected into the light-emitting portion 42 through the electrode 42a, an active layer 44 emits light. When the injected current exceeds an oscillating threshold, the reflection caused by a front cleavage face 45 of the semiconductor laser 21a and a diffraction grating 43 provided on the DBR portion 40 allows oscillation to occur, whereby a laser oscillates.

The change in the current injected into the DBR portion 40 of the semiconductor laser 21a causes the change in the refractive index; as a result, the feedback wavelength changes. By utilizing this principle, the DBR portion 40 can be operated as a wavelength variable portion, whereby the oscillating wavelength of a laser can be varied.

Furthermore, when a current is injected into the phase control portion 41 through the electrode 41a, the oscillating wavelength can be continuously varied. Thus, the phase control portion 41 also operates as a wavelength variable portion.

Next, a method for stabilizing the output of higher harmonic waves will be described.

When ambient temperature changes, the phase-matched wavelength of the light wavelength conversion device 22a changes. By changing the oscillating wavelength of the DBR semiconductor laser 21a, the oscillating wavelength of the laser 21a can be matched with the changed phase-matched wavelength in light wavelength conversion device 22a.

At this time, the output of higher harmonic waves from the light wavelength conversion device 22a is divided by a beam splitter 27 and a part of the output can be monitored by a Si detector 28. According to this structure, a value of a current to be applied to the electrodes 40a and 41a can be regulated so that the output of higher harmonic waves always takes the highest value, and the output of the higher harmonic waves P2 can be stably maintained at an intended value.

The output of higher harmonic waves can be controlled by, for example, the following method.

First, the value of a current to be injected into the electrodes 40a and 41a is slightly changed into the (+) direction, and the output of the higher harmonic waves P2 is detected. When the output of the higher harmonic waves P2 decreases, the value of the current is changed into the (−) direction, thereby increasing the output of the higher harmonic waves P2. When the output of the higher harmonic waves P2 increases from the intended value, the value of the current is changed into the (+) direction. By repeating this, the output of the higher harmonic waves P2 can be always kept at around a peak value.

Figure 2:
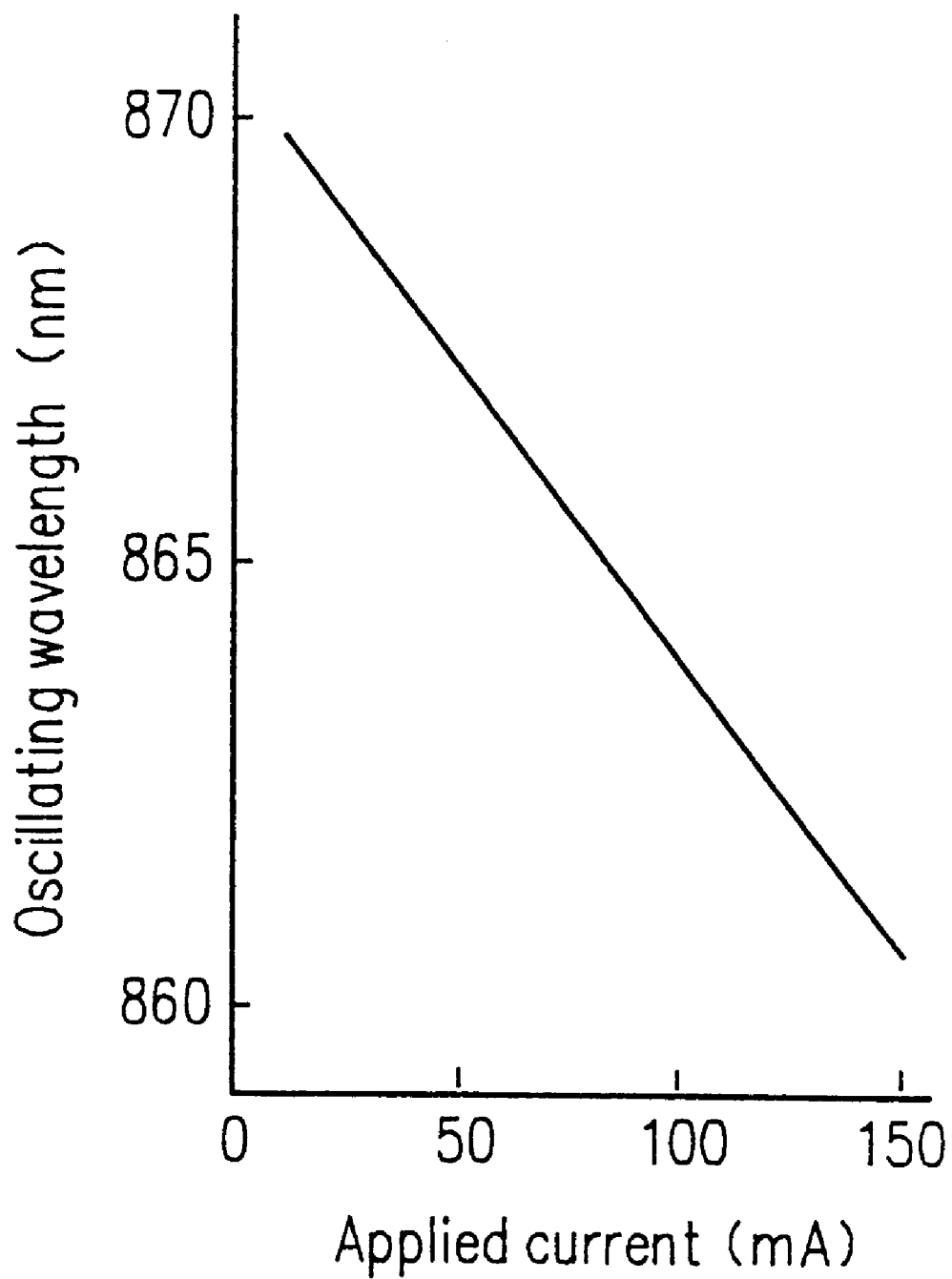
FIG. 2 is a graph showing the relationship between the applied current and the oscillating wavelength of a semiconductor laser in Embodiment 1 of the present invention.

FIG. 2 is a graph showing the relationship between the current applied to the electrode 40a in the semiconductor laser 21a and the oscillating wavelength thereof. As is understood from FIG. 2, when the injected current changes by about 150 mA, the oscillating wavelength changes by about 10 nm. Thus, even when the quasi-phase-matched wavelength changes, the oscillating wavelength of the semiconductor laser is changed in a wide range by controlling the value of the injected current so that the oscillating wavelength is matched with the phase-matched wavelength.

Figure 3:
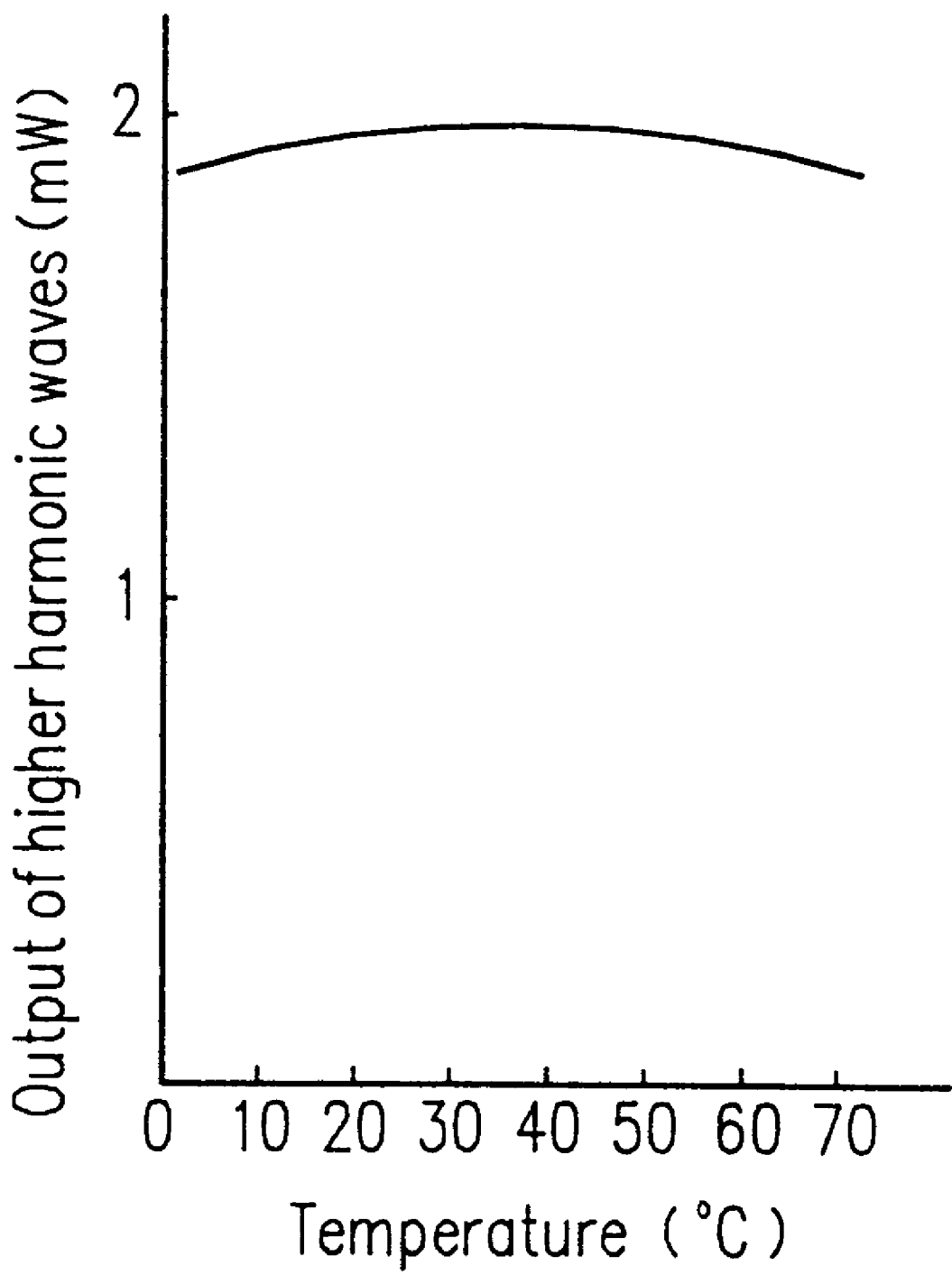
FIG. 3 is a graph showing the relationship between the ambient temperature and the output of higher harmonic waves.

FIG. 3 is a graph showing the relationship between the ambient temperature and the output of higher harmonic waves. As is understood from FIG. 3, when the ambient temperature is in the range of 0 to 70° C., the output of the higher harmonic waves fluctuate within ±3%.

In the short wavelength laser beam source 100 in this embodiment, the fundamental waves are converted into the higher harmonic waves at an efficiency of 5% with respect to the input power of 40 mW. Even after an operation time elapses, optical damages are not caused; for example, the fluctuation of the output of the higher harmonic waves during the continuous operation of 500 hours is very stable, i.e., within ±3%.

Furthermore, when the incident face 10 and the output face 12 of the light wavelength conversion device 22a are subjected to coating for the purpose of preventing reflection, the reflection with respect to the fundamental waves is prevented, and a stable operation of the DBR semiconductor laser can be realized. Preferably, the reflectance with respect to the fundamental waves is set to be 0.2% or less. When the reflectance is larger than this, there are cases where the operation becomes unstable.

Next, the modulation of the output of the higher harmonic waves will be described.

In the above-mentioned structure of the short wavelength laser beam source 100, the refractive index changes efficiently with respect to the current applied to the DBR portion 40. This enables the oscillating wavelength of the semiconductor laser 21a to modulate. For example, when a current is applied to the DBR portion 40 under the condition that the phase is matched in the initial state, the refractive index greatly changes and the oscillating wavelength of the semiconductor laser 21a shifts from the phase-matched wavelength of the light wavelength conversion device 22a. Thus, the On/Off control of the output of the higher harmonic waves can be performed by using the change in a current injected into the DBR portion 40. In the structure of the short wavelength laser beam source 100, it is confirmed that the output of the higher harmonic waves is modulated by applying an injection current, which is applied with a modulated signal of 10 MHz, to the electrode 40a.

Embodiment 2

Figure 4:
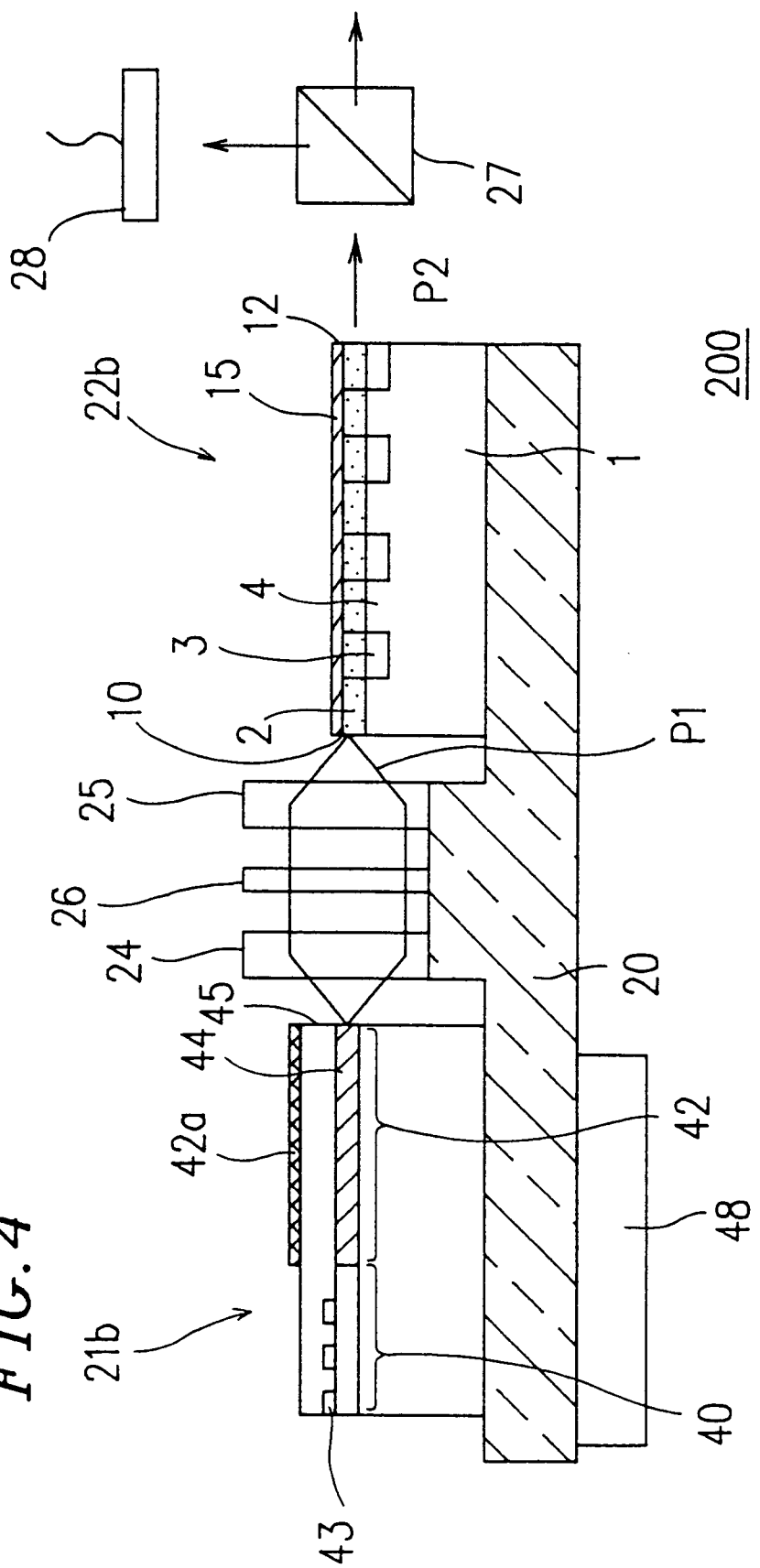
FIG. 4 is a cross-sectional view showing a structure of a short wavelength laser beam source in Embodiment 2 of the present invention.

FIG. 4 is a cross-sectional view showing a structure of a short wavelength laser beam source 200 in Embodiment 2 of the present invention.

The short wavelength laser beam source 200 includes a light wavelength conversion device 22b in which periodically domain-inverted regions 3 are formed on the surface of a LiTaO$_3$ substrate of −Z plate (minus side of a substrate cut out in the vertical direction of a Z-axis). Furthermore, an optical waveguide 2 is formed by proton exchange on the surface of the light wavelength conversion device 22b on which the periodically domain-inverted regions 3 are formed. LiTaO$_3$ is a material with which the optical waveguide 2 and the domain-inverted region 3 are easily formed.

The short wavelength laser beam source 200 also includes a DBR semiconductor laser 21b having a wavelength variable portion. The DBR semiconductor laser 21b and the light wavelength conversion device 22b are fixed on a base member 20 made of Al. Fundamental waves P1 emitted from the semiconductor laser 21b are collimated by a collimator lens 24, pass through a semi-wavelength plate 26, are focused by a focus lens 25, and are incident upon the optical waveguide 2 of the light wavelength conversion device 22b through an incident face 10. The semi-wavelength plate 26 is inserted so as to rotate the polarization direction of the fundamental waves P1 by 90° and match it with the polarization direction of the optical waveguide 2.

The fundamental waves P1 incident upon the optical waveguide 2 are converted into higher harmonic waves P2 in the domain-inverted region 3 having a phase-matched length L. Then, the power of the higher harmonic waves P2 is amplified in the subsequent non-domaininverted region 4 also having a phase-matched length L. The higher harmonic waves P2 thus amplified in the optical waveguide 2 are output from an output face 12.

Next, the DBR semiconductor laser 21b will be described.

The DBR semiconductor laser 21b includes a light-emitting portion 42 and a DBR portion 40. When a current is injected into the light-emitting portion 42 through the electrode 42a, an active layer 44 emits light. When the injected current exceeds an oscillating threshold, the reflection caused by a front cleavage face 45 of the semiconductor laser 21b and a diffraction grating 43 provided on the DBR portion 40 allows oscillation to occur, whereby a laser oscillates. By injecting a predetermined current into the electrode 42a, the power of the fundamental waves P1 to be oscillated becomes constant.

Next, a stable operation of the short wavelength laser beam source 200 will be described.

In the short wavelength laser beam source 200 shown in FIG. 4, a thin film heater 15 is formed on the optical waveguide 2 of the light wavelength conversion device 22b. The reflectance of LiTaO₃ changes with the change in temperature, which causes the change in the phase-matched wavelength; however, the surface temperature of the light wavelength conversion device 22b is maintained at a substantially constant value because of the thin film heater 15. On the other hand, the temperature of the DBR semiconductor laser 21b is kept at a constant temperature, for example, 20° C. by a Peltier device 48 provided on the reverse surface of the base member 20.

The oscillating wavelength of the DBR semiconductor laser 21b is stable compared with that of ordinary Fabry-Perot lasers. The reason for this is as follows: The oscillating wavelength of the DBR semiconductor laser is determined based on the period of the diffraction grating 43 of the DBR portion 40 and the effective refractive index thereof. Even when a current injected into the active layer 44 through the electrode 42a is changed, the oscillating wavelength is hardly affected. Therefore, the oscillating wavelength does not change when temperature is kept constant. Although the change in refractive index can slightly fluctuate wavelength over a long period of time, the amount of such a change is negligible; thus, such a change can be coped with by slightly changing a drive current for the semiconductor laser 21b. Also, the great change in the oscillating wavelength can be stabilized by changing the temperature of the thin film heater of the light wavelength conversion device.

Next, a method for producing the light wavelength conversion device will be described with reference to FIGS. 5A through 5D.

Figure 5A:
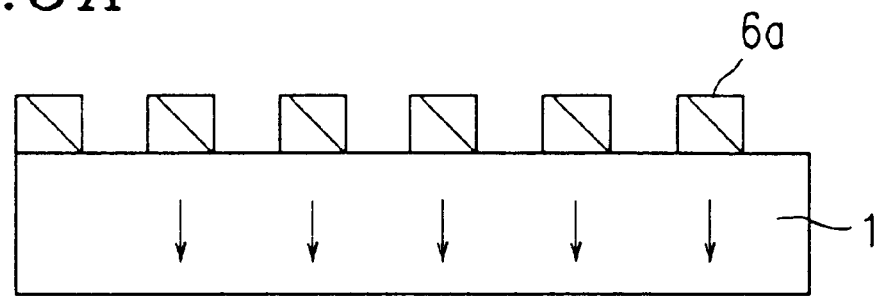
FIGS. 5A through 5D are cross-sectional views showing the steps of producing a light wavelength conversion device included in the short wavelength laser beam source of FIG. 4.
Figure 5B:
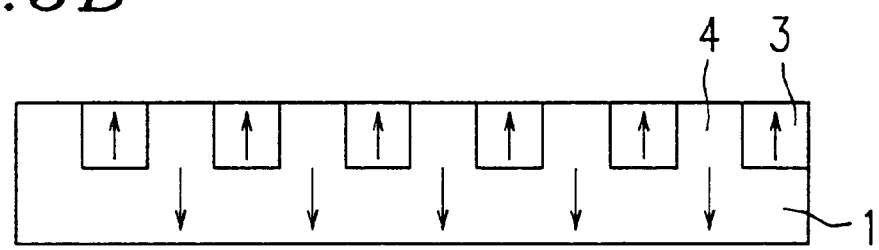

As shown in FIG. 5A, a Ta film 6a is formed on a LiTaO₃ substrate 1 in a predetermined periodic pattern by ordinary photoprocess and dry etching. The LiTaO₃ substrate 1 with the Ta film 6a formed thereon is subjected to a proton-exchange processing at 260° C. for 30 minutes in pyrophosphoric acid, whereby a proton-exchange layer with a thickness of 0.8 µm is formed on portions of the surface of the substrate 1 which are not covered with the Ta film 6a. Thereafter, the resultant substrate 1 is heat-treated at 550° C. for 1 minute. As a result, periodically domain-inverted regions 3 are formed as shown in FIG. 5B. The areas covered with the Ta film 6a correspond to non-domain-inverted regions 4.

Figure 5C:
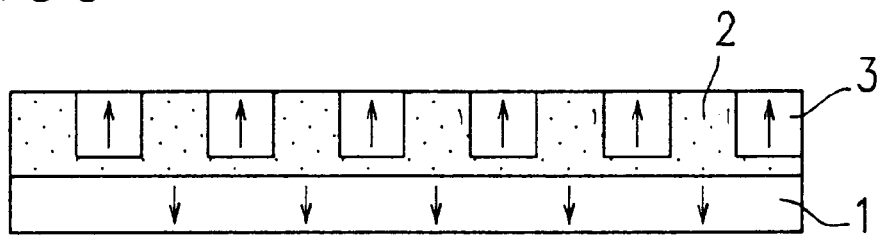

Then, the Ta film 6a is removed, and another Ta film with a thickness of 30 nm is formed on the surface of the substrate 1 in a stripe pattern as a protective mask for proton exchange in the subsequent step of forming an optical waveguide. Thereafter, the resultant substrate 1 is subjected to a proton-exchange processing at 260° C. for 16 minutes, followed by being annealed at 380° C. for 10 minutes. As a result, an optical waveguide 2 as shown in FIG. 5C is formed. The Ta film is then removed.

Figure 5D:
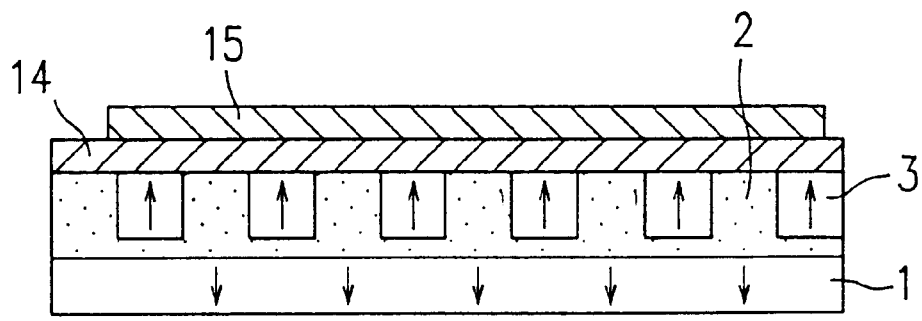

Furthermore, as shown in FIG. 5D, a SiO₂ layer 14 is formed on the resultant substrate 1 as a protective film, and a Ti film is formed on the SiO₂ film 14. The thickness of the Ti film is typically about 200 nm. Then, the Ti film is patterned to a predetermined shape by using photolithography and etching to form a thin film heater 15.

Finally, incident and output faces are formed on the respective facets of the substrate 1 by polishing.

The optical waveguide 2 formed by the abovementioned process typically has a width of about 4 µm and a length of about 1 cm. The domain-inverted regions 3 has a period of about 3.8 µm and a thickness of about 2.0 µm. The arrows in FIGS. 5A through 5D represent the direction of domains in each region.

In the light wavelength conversion device 200 provided with the thin film heater 15, the change in the quasi-phase-matched wavelength hardly affects the operational characteristics; thus, the device 200 can be used in a wide range of environment temperatures. The efficiency of the conversion from the fundamental waves P1 to the higher harmonic waves P2 is 2.5% with respect to the input of 40 mW at a wavelength of 858 nm. Also, in the device 200, the output of higher harmonic waves can be obtained in a very stable manner without any optical damages. Furthermore, regarding the output of the higher harmonic waves from the optical waveguide 2, a spot without astigmatism can be easily and stably obtained.

Embodiment 3

Figure 6:
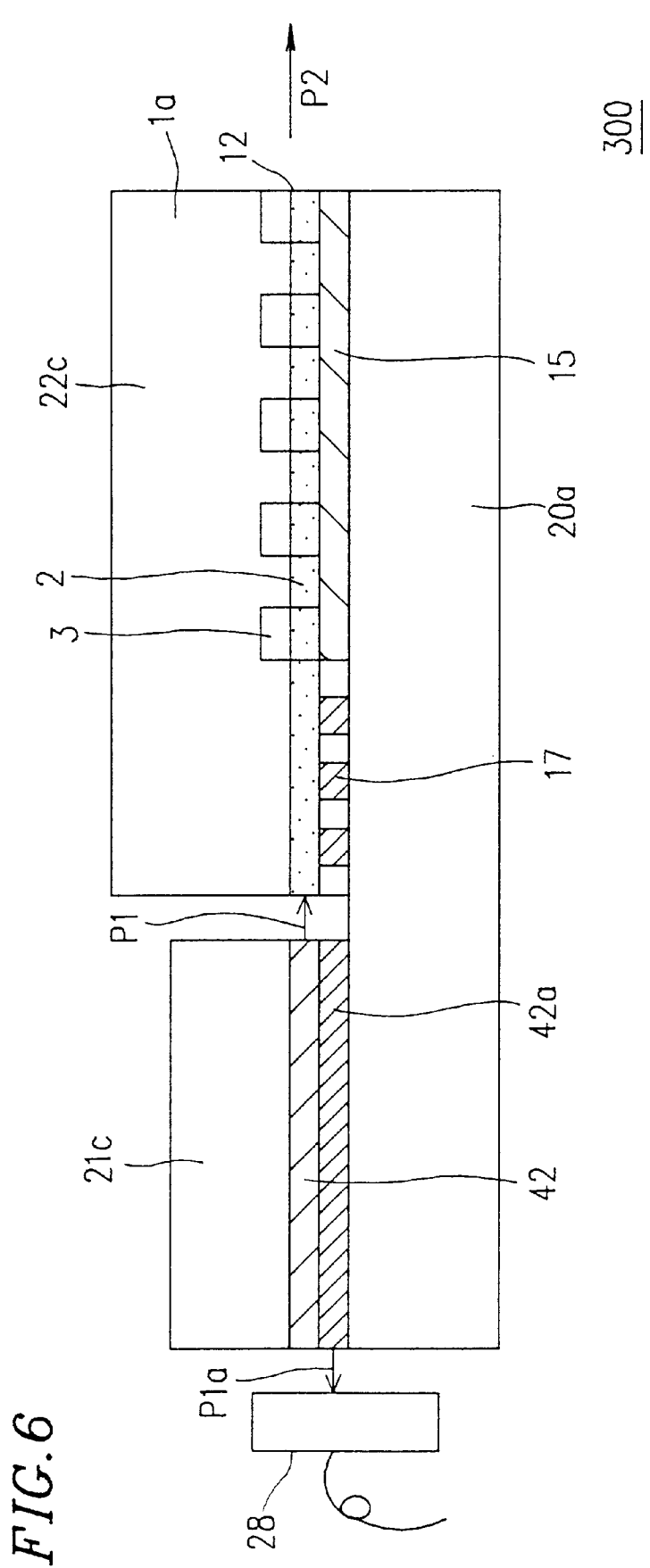
FIG. 6 is a cross-sectional view showing a structure of a short wavelength laser beam source in Embodiment 3 of the present invention.

FIG. 6 is a cross-sectional view showing a structure of a short wavelength laser beam source 300 in Embodiment 3 of the present invention.

The short wavelength laser beam source 300 basically includes a Fabry-Perot semiconductor laser 21c and a light wavelength conversion device 22c fixed on a Si submount 20a.

Fundamental waves P1 emitted from the semiconductor laser 21c are directly introduced into an optical waveguide 2 of the light wavelength conversion device 22c and converted into higher harmonic waves P2 while being propagated through the optical waveguide 2. Here, the light wavelength conversion device 22c has the same domain-inverted structure as that of the light wavelength conversion device 22a in Embodiment 1.

In the light wavelength conversion device 22c of this embodiment, a LiNbO₃ substrate 1a doped with MgO is heat-treated at 1120° C. to form domain-inverted regions 3. Furthermore, as the optical waveguide 2, a proton-exchange optical waveguide is used, which can be formed by a treatment at a temperature lower than that of the heat treatment in the course of forming the domain-inverted regions 3. A thin film heater 15 is formed on the optical waveguide 2. The light wavelength conversion device 22c having the above structure is positioned on the Si submount 20a so that the thin film heater 15 faces the Si submount 20a.

The fundamental waves P1 emitted from the semiconductor laser 21c, after being incident upon the light wavelength conversion device 22c, is reflected from a diffraction grating 17 and has its wavelength locked. On the other hand, part P1a of the fundamental waves P1 is output from the facet of the semiconductor laser 21c opposite to the output face (facet facing the light wavelength conversion device 22c), and the amount of the part P1a is detected by a Si detector 28. When the control current of the semiconductor laser 21c is regulated by the feedback control based on the detected amount of the part P1a so that the output of the fundamental waves P1 supplied to the light wavelength conversion device 22c becomes maximum, the output of the higher harmonic waves P2 can be consequently kept constant.

Figure 7:
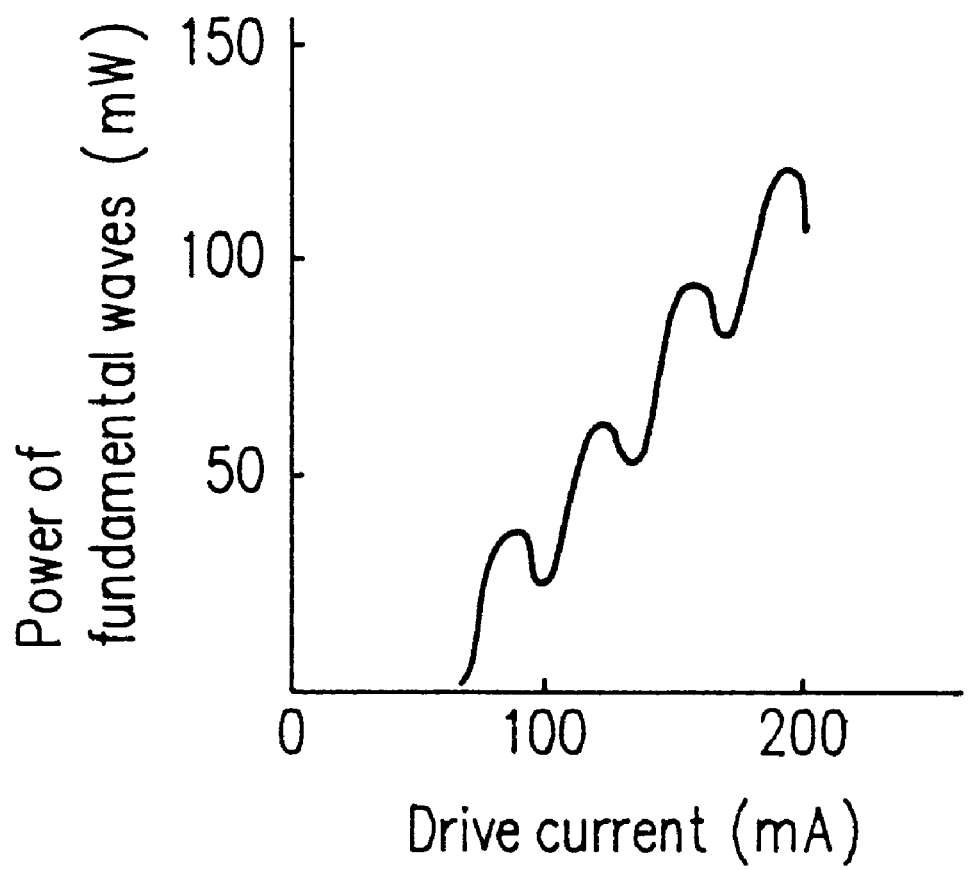
FIG. 7 is a graph showing the relationship between the drive current of a semiconductor laser and the power of the fundamental waves emitted therefrom.

FIG. 7 is a graph showing the relationship between the drive current of the semiconductor laser 21c and the power of the fundamental waves.

Under the condition where optical feed-back is established, the oscillating wavelength of the semiconductor laser 21c is fixed to a mode which is closest to the feed-back mode (determined by the length and the refractive index of the semiconductor laser 21c). However, when the temperature and the drive current changes, a mode to which the oscillating wavelength is fixed is replaced by another mode. For example, upon the change in the drive current when the value of the drive current coincides with that of a current causing mode hopping, the output of the semiconductor laser 21c becomes minimum; on the other hand, when the value of the drive current coincides with that of a current providing an oscillating wavelength identical with a peak wavelength to be fed back, the output of the semiconductor laser 21c becomes maximum. Because of this, when the value of the drive current increases, the periodical increase and decrease in the output are recognized as shown in FIG. 7.

In the structure of the short wavelength laser beam source 300 shown in FIG. 6, the amount of the part P1a emitted from the semiconductor laser 21c on the opposite side of the light wavelength conversion device 22c has a correlation with the amount of the fundamental waves P1 incident upon the light wavelength conversion device 22c. Thus, even when temperature changes, stabilization control for putting the output of the fundamental waves in a peak state, i.e., for keeping a stable state of a mode can be performed by detecting the output of the part P1a by the detector 28 and feeding back the detected result to change the drive current. Because of this stabilization control, the fundamental waves of 80 mW can be converted into higher harmonic waves at a conversion efficiency of 4% and very stable output can be obtained in a temperature range of about ±30° C.

As described above, in the short wavelength laser beam source 300 in this embodiment, the oscillating wavelength of the semiconductor laser 21c is stabilized, and even when ambient temperature changes, the temperature of the optical waveguide 2 of the light wavelength conversion device 22c is kept constant by the thin film heater 15. Because of this, the maximum output of the higher harmonic waves (3 mW) can be always kept constant. The relative noise field intensity is very low, i.e., −140 dB/Hz, which is a practical value. When mode hopping of the fundamental waves takes place, noise increases, making it difficult to read information from an optical disk; however, according to this embodiment, the mode hopping is prevented from occurring, leading to the improvement of usefulness of short wavelength laser devices.

It is noted that monitoring of the output of the fundamental waves by the detector 28 can be performed with respect to the fundamental waves output from the optical waveguide 2.

Thus, by changing the drive current of the semiconductor laser 21c, the oscillating wavelength is regulated to be stabilized. As described above, when the oscillating wavelength is locked by optical feed-back, the fundamental waves periodically increase and decrease, and a peak can be easily detected. As a method of optical feed-back, those other than DBR described above can be used. For example, an external diffraction grating, the reflection at a confocal optical system, etc. can be applied.

Embodiment 4

A short wavelength laser beam source in Embodiment 4 of the present invention will be described.

The short wavelength laser beam source of this embodiment has the same structure as that of the short wavelength laser beam source 100 described in Embodiment 1 with reference to FIG. 1. A control method in this embodiment is different from that of Embodiment 1; this embodiment uses both fine control and coarse control.

The short wavelength laser beam source 100 includes a light wavelength conversion device 22a in which periodically domain-inverted regions 3 are formed on the surface of a substrate 1 made of non-linear optical crystal, $LiTaO_3$. Furthermore, an optical waveguide 2 is formed by proton exchange on the surface of the light wavelength conversion device 22a on which the periodically domain-inverted regions 3 are formed.

The short wavelength laser beam source 100 also includes a DBR semiconductor laser 21a having a wavelength variable portion. The DBR semiconductor laser 21a and the light wavelength conversion device 22a are fixed on a base member 20 made of Al. Fundamental waves P1 emitted from the semiconductor laser 21a are collimated by a collimator lens 24, pass through a semi-wavelength plate 26, are focused by a focus lens 25, and are incident upon the optical waveguide 2 of the light wavelength conversion device 22a through an incident face 10. The semi-wavelength plate 26 is inserted so as to rotate the polarization direction of the fundamental waves P1 by 90° and match it with the polarization direction of the optical waveguide 2.

The fundamental waves P1 incident upon the light wavelength 2 are converted into higher harmonic waves P2 in the domain-inverted region 3 having a phase-matched length L. Then, the power of the higher harmonic waves P2 is amplified in the subsequent non-domain-inverted region 4 also having a phase-matched length L. The higher harmonic waves P2 thus amplified in the optical waveguide 2 are output from an output face 12.

The wavelength at which the higher harmonic waves are generated (phase-matched wavelength) is determined by quasi-phase match based on the refractive index of nonlinear optical crystal and the period of the domain-inverted regions 3. Because of this, the change in ambient temperature causes the change in the refractive index of the non-linear optical crystal; as a result, the phase-matched wavelength changes.

Next, the DBR semiconductor laser 21a will be described.

The DBR semiconductor laser 21a includes a light-emitting portion 42, a phase control portion 41, and a DBR portion 40. The light-emitting portion 42, the phase control portion 41, and the DBR portion 40 can be independently controlled by electrodes 42a, 41a, and 40a, respectively. When a current is injected into the light-emitting portion 42 through the electrode 42a, an active layer 44 emits light. When the injected current exceeds an oscillating threshold, the reflection caused by a front cleavage face 45 of the semiconductor laser 21a and a diffraction grating 43 provided on the DBR portion 40 allows oscillation to occur, whereby a laser oscillates.

The change in the current injected into the DBR portion 40 of the semiconductor laser 21a causes the change in the refractive index; as a result, the feedback wavelength changes. By utilizing this principle, the DBR portion 40 can be operated as a first wavelength variable portion, whereby the oscillating wavelength of a laser can be varied.

Furthermore, when a current is injected into the phase control portion 41 through the electrode 41a, the oscillating wavelength can be continuously varied. Thus, the phase control portion 41 operates as a second wavelength variable portion.

In particular, in this embodiment, the control by the DBR portion 40 is assumed to be coarse control and the control by the phase control portion 41 is assumed to be fine control. A method for stabilizing the output of higher harmonic waves in this embodiment will be described by illustrating the rising time of the short wavelength laser beam source 100 with reference to a flow chart in FIG. 8.

It is assumed that when a power source is turned on, the oscillating wavelength is shifted from the phase-matched wavelength, and higher harmonic waves are not generated. The output of higher harmonic waves is divided by a beam splitter 27 and part of it is monitored by a Si detector 28.

Figure 9:
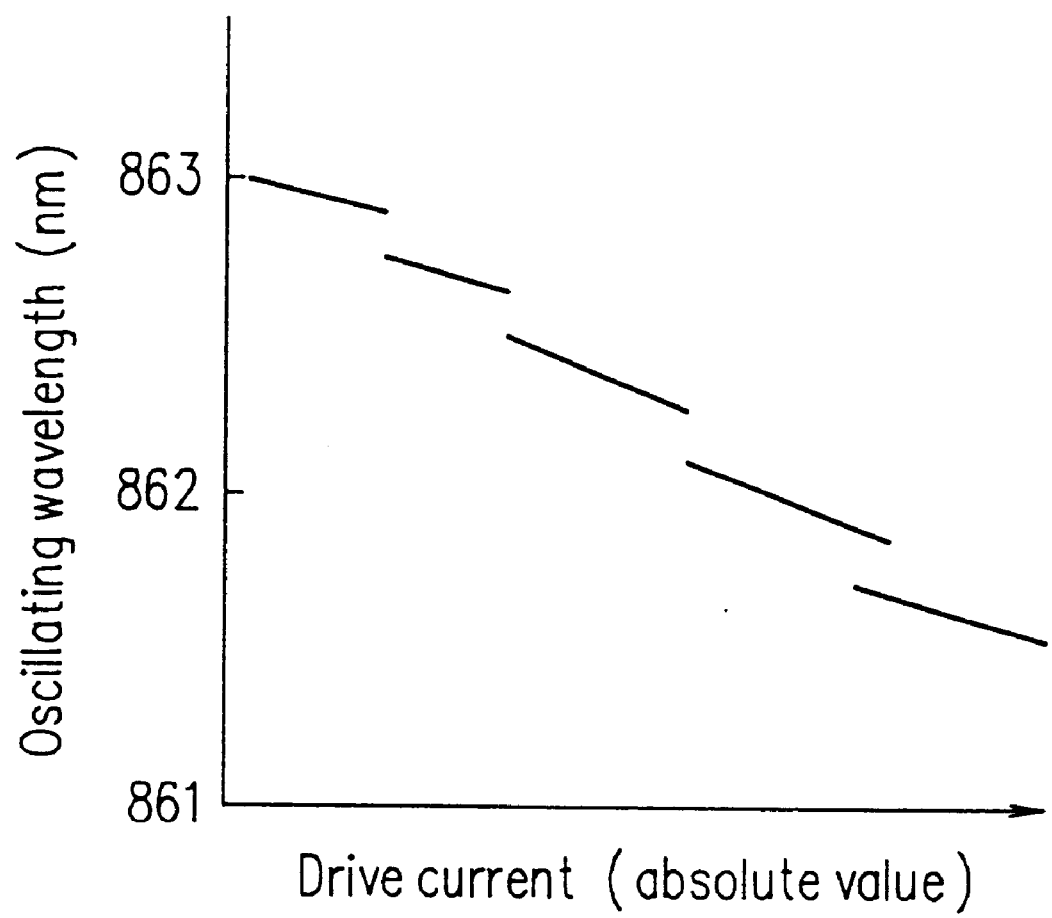
FIG. 9 is a graph showing the relationship between the drive current at a distribution Bragg reflection (DBR) portion of a semiconductor laser and the oscillating wavelength thereof in Embodiment 4 of the present invention.

First, a drive current of the DBR portion 40 is changed (Step 810). As is understood from the graph showing the relationship between the drive current value and the oscillating wavelength in FIG. 9, when the drive current flowing through the electrode 40a of the DBR portion 40 is changed, the oscillating wavelength changes while partially conducting the mode hopping. When the oscillating wavelength comes close to the phase-matched wavelength, higher harmonic waves P2 are generated. When the generation of the higher harmonic waves P2 is detected (Step 820), a current flowing to the DBR portion 40 is fixed (Step 830).

Next, in step 840, a current flowing through the electrode 41a of the phase control portion 41 is changed (Step 840). In the case where the current flowing to the phase control portion 41 is changed, a range in which the oscillating wavelength can vary without mode hopping is broader compared with the case where the current of the DBR portion 40 is changed. Because of this, the oscillating frequency can be readily adjusted to the wavelength at which the output of the higher harmonic waves reaches a peak. In this manner, whether or not the output of the higher harmonic waves becomes maximum is detected (Step 850), and when the output becomes maximum, a current flowing through the phase control portion 41 is fixed (Step 860).

In the above-mentioned operation, the oscillating wavelength is set in such a manner that the maximum output of the higher harmonic waves is obtained.

When ambient temperature changes, the phase-matched wavelength of the light wavelength conversion device 22a changes. In this case, by changing the oscillating wavelength of the DBR semiconductor laser 21a, the oscillating wavelength can be matched with the thus changed quasi-phase-matched wavelength of the light wavelength conversion device 22a. Specifically, in the same process as described above, the higher harmonic waves P2 can be stably obtained by regulating a current applied to the electrodes 40a and 41a in such a manner that the output of the higher harmonic waves always has the maximum value. Furthermore, regarding the change in the quasi-phase-matched wavelength of the light wavelength conversion device, the oscillating wavelength of the semiconductor laser can be regulated in accordance with the change in the phase-matched wavelength by changing the oscillating wavelength in a broad range.

Figure 8:
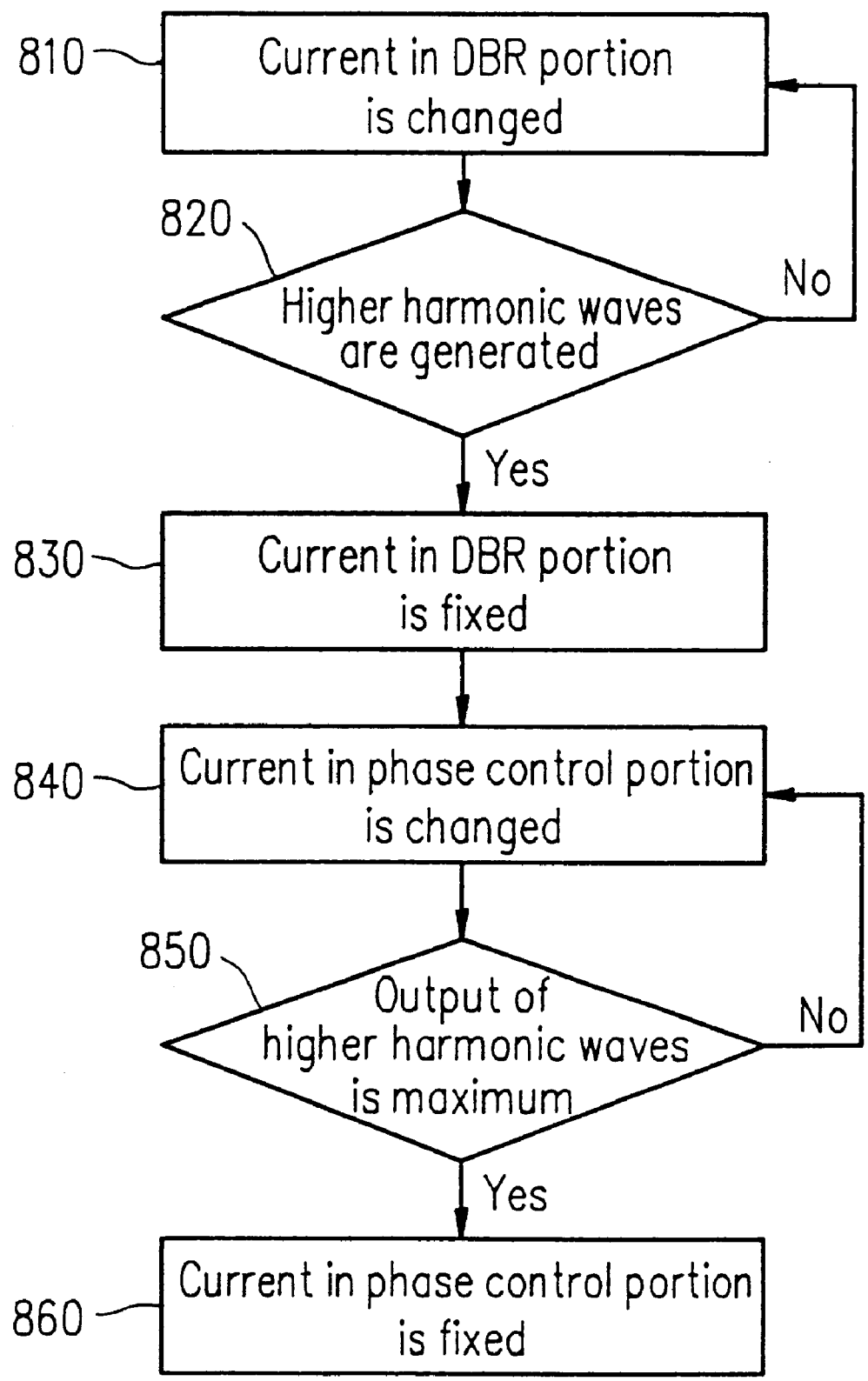
FIG. 8 is a flow chart showing a method for stabilizing the output of higher harmonic waves in Embodiment 4 of the present invention.

In this embodiment, fluctuation in the output of the higher harmonic waves can be suppressed within ±2% at a temperature in the range of 0 to 70° C. The conversion efficiency at which the fundamental waves are converted into the higher harmonic waves is 5% with respect to an input of 40 mW. Even when the control as shown in the flow chart of FIG. 8 is performed, the rising time of the semiconductor laser is short, i.e., within 0.1 seconds. Furthermore, even after a continuous operation for a long period of time, i.e., 500 hours, optical damages are not caused; the output of the higher harmonic waves is very stable, i.e., within ±2%.

Such a stable operation can be achieved by the combination of the coarse control and fine control with respect to the oscillating wavelength. Specifically, the application of a current to the DBR portion 40, capable of changing the oscillating wavelength in a broad range although slight mode hopping is generated in the change in the oscillating wavelength, is used for the coarse control; on the other hand, the application of a current to the phase control portion 41, in which a variable range of the oscillating wavelength is narrow although mode hopping is not generated, is used for the fine control. In this way, the oscillating wavelength can be controlled in a wide range at high speed.

Figure 10:
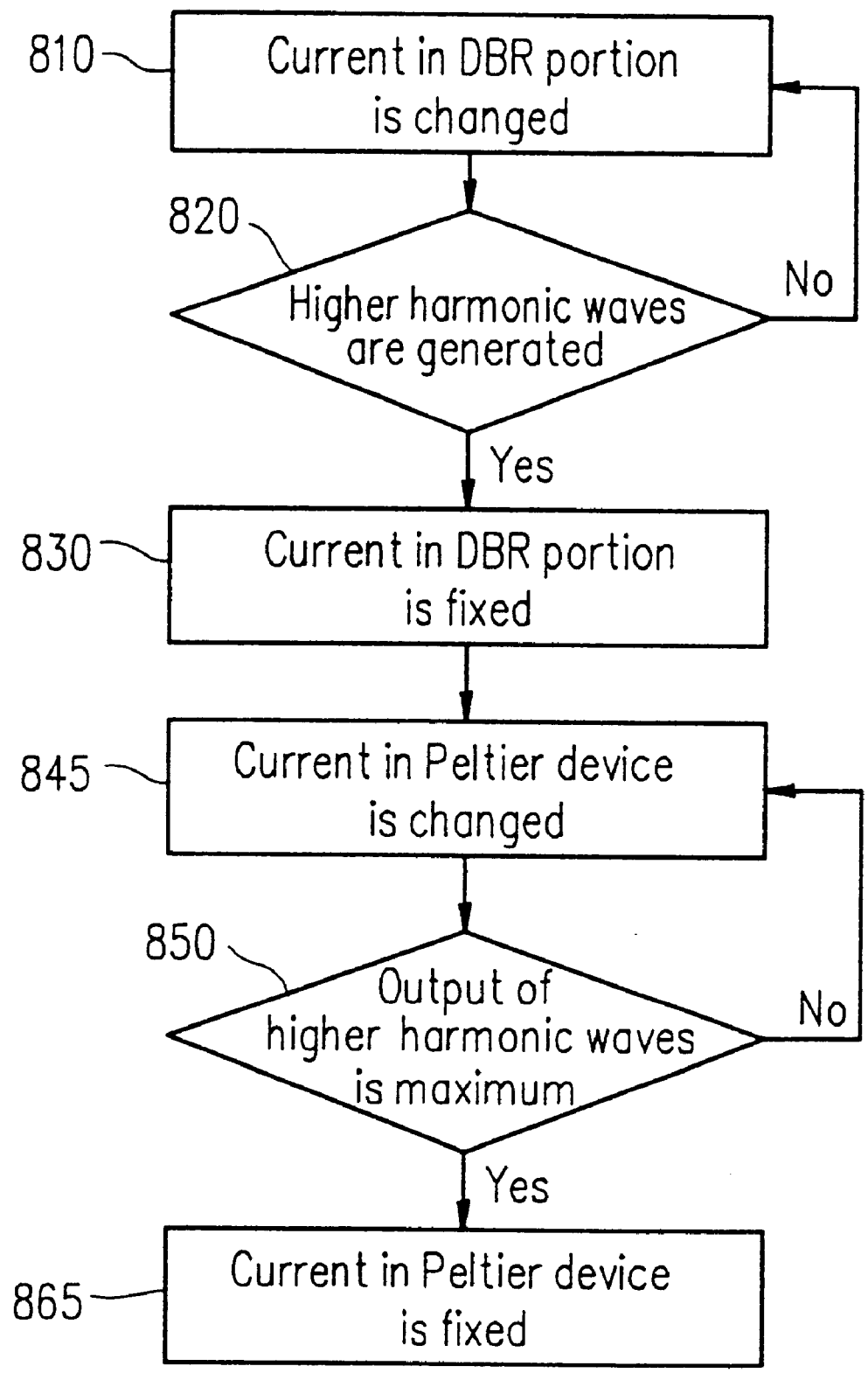
FIG. 10 is a flow chart showing a method for stabilizing the output of higher harmonic waves in the case of utilizing a Peltier device for fine control in Embodiment 4 of the present invention.

In the above-mentioned series of controls described above with reference to FIG. 8, the change in temperature by the Peltier device is utilized for the fine control. FIG. 10 shows the control flow chart in this case. Specifically, in place of the control (Steps 840 and 860) of a current flowing through the phase control portion shown in FIG. 8, the change in temperature is caused by controlling the current flowing through the Peltier device (Steps 845 and 865). By doing so, the oscillating wavelength is controlled in combination with the control of a current flowing through the DBR portion 40. Other steps in FIG. 10 are the same as those in FIG. 8; therefore, the description thereof are omitted here.

According to a control method using the Peltier device shown in FIG. 10, the fluctuation of the output of the higher harmonic waves can be suppressed within ±2%. In this case, it is not required to form the phase control portion 41 in the semiconductor laser; therefore, the semiconductor laser can be formed with good yield.

By forming the thin film heater to control the passage current thereto, fine control can also be performed. In particular, when the heater is integrated on the DBR semiconductor laser, the semiconductor laser or the short wavelength laser beam source can be miniaturized.

As long as the oscillating wavelength can be changed in a wide range, any methods can be used for coarse control. Also, by forming the thin film heater on the light wavelength conversion device, fine control can be performed by using the passage current thereto. More specifically, even when the second wavelength variable portion is provided in the light wavelength conversion device, continuous fine control of the oscillating wavelength can be performed.

Embodiment 5

A short wavelength laser beam source in Embodiment 5 of the present invention will be described with reference to FIG. 11.

In this embodiment, an optical waveguide type light wavelength conversion device 22d is used as the one included in a short wavelength laser beam source. In the light wavelength conversion device 22d, periodically domain-inverted regions 3 are formed in a LiTaO$_3$ substrate 1 and an optical waveguide 2 is formed by proton exchange. Fundamental waves P1 incident through an incident face 10 are converted into higher harmonic waves P2 while propagating through the optical waveguide 2 and output from an output face 12.

As a control method for stabilizing the output of the higher harmonic waves P2 to be output, a method of differential detection is used in the light wavelength conversion device 22d. For this purpose, in the light wavelength conversion device 22d, second periodically domain-inverted regions 3a having a short period (period: Λ1) and third periodically domain-inverted regions 3b having a long period (period: Λ2) are formed in portions closer to the incident face 10 in addition to the first periodically domain-inverted regions 3 performing ordinary wavelength conversion. Specifically, three kinds of the periodically domain-inverted regions 3a, 3b, and 3 respectively having different periods are provided. The relationship between the periods is Λ1<Λ<Λ2.

Furthermore, diffraction gratings 17a and 17b having different pitches are formed on the periodically domain-inverted regions 3a and 3b, respectively. The diffraction gratings 17a and 17b allow the fundamental waves P1 incident through the incident face 10 to pass through. However, higher harmonic waves P2a and P2b converted from the fundamental waves P1 by the second and third periodically domain-inverted regions 3a and 3b are diffracted toward the inside of a substrate 1. Furthermore, detectors 28a and 28b are provided on the reverse surface of the substrate 1 so as to allow the diffracted higher harmonic waves P2a and P2b to be incident thereupon.

Figure 11:
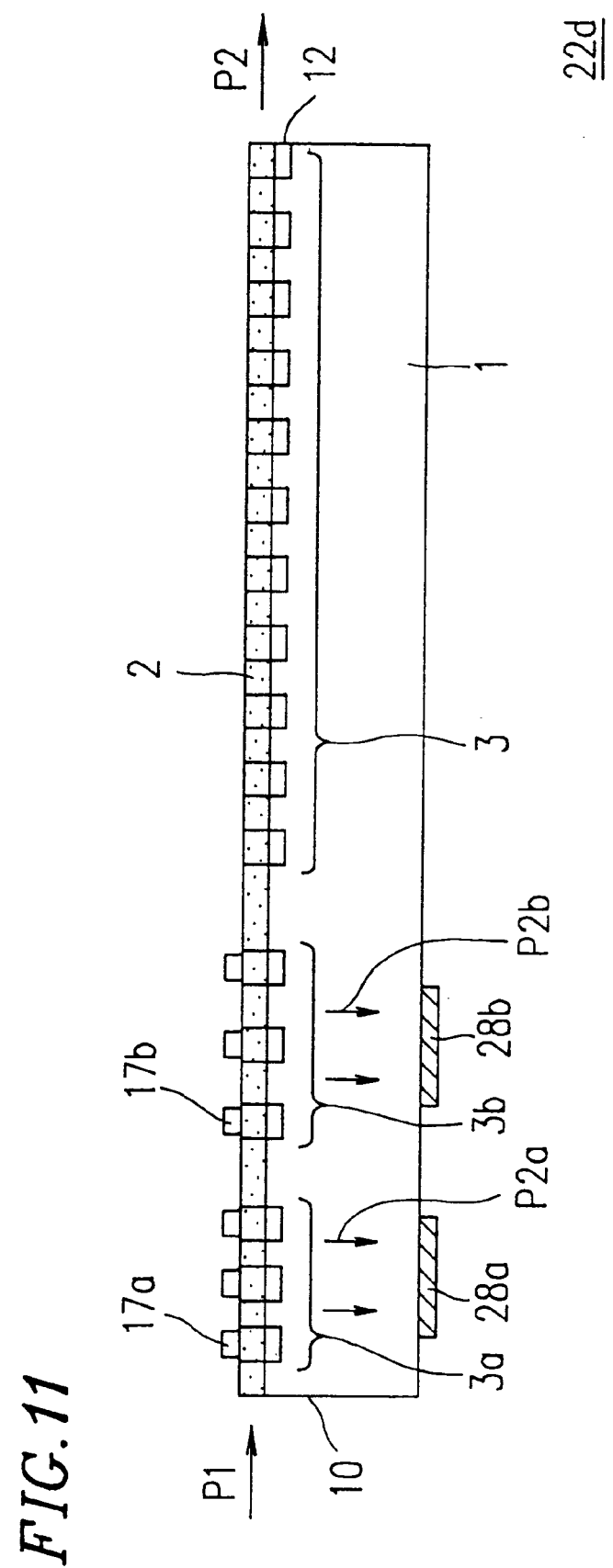
FIG. 11 is a cross-sectional view showing a structure of a light wavelength conversion device included in a short wavelength laser beam source in Embodiment 5 of the present invention.

Although not shown in FIG. 11, as a semiconductor laser, a DBR semiconductor laser having a wavelength variable function is used. The fundamental waves P1 emitted from the semiconductor laser are incident upon the optical waveguide 2 of the light wavelength conversion device 22d. The fundamental waves P1 incident upon the optical waveguide 2 are converted into higher harmonic waves P2a, P2b, and P2 by the periodically domain-inverted regions 3, 3a, and 3b, respectively.

Figure 12:
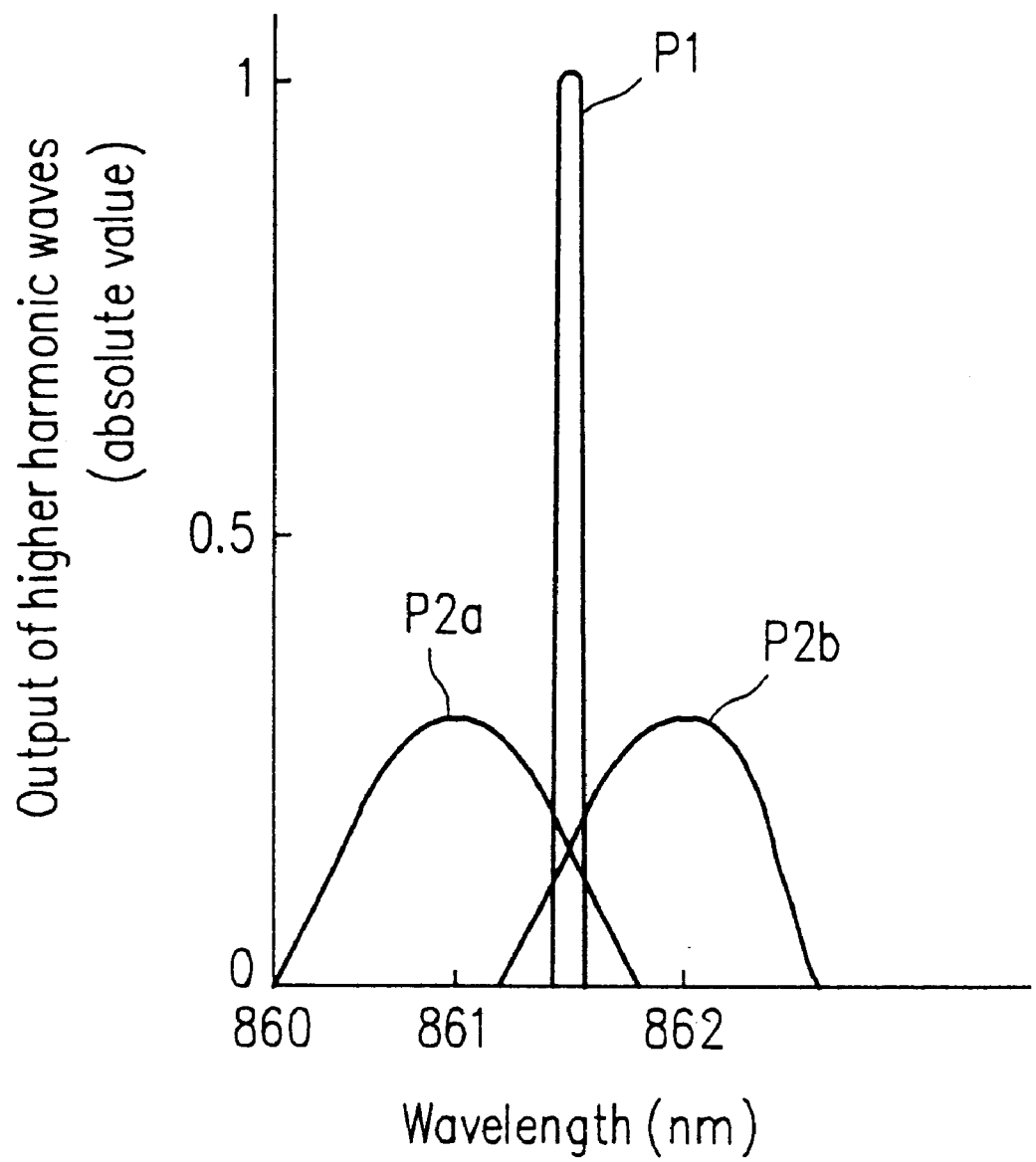
FIG. 12 is a graph showing the relationship between the wavelength of fundamental waves input to the light wavelength conversion device of FIG. 11 and the output of higher harmonic waves therefrom.

FIG. 12 shows a graph showing the relationship between the wavelength of the fundamental waves to be input and the output of the higher harmonic waves to be generated from the fundamental waves. A region where the second periodically domain-inverted regions 3a are formed has a length of 1 mm, a phase-matched wavelength (peak wavelength) of 861 nm, and a wavelength half value width of 1 nm. A region where the third periodically domain-inverted regions 3b are formed has a length of 1 mm, a phase-matched wavelength of 862 nm, and a wavelength half value width of 1 nm. A region where the first periodically domain-inverted regions 3 are formed has a length of 9 mm, a phase-matched wavelength of 861.5 nm, and a wavelength half value width of 0.1 nm.

When the oscillating wavelength of the semiconductor laser is matched with the phase-matched wavelength of the light wavelength inversion device, the first periodically domain-inverted regions 3 react to generate the higher harmonic waves P2, which are output from the output face 12. However, when the oscillating wavelength is shorter than the phase-matched wavelength of the light wavelength inversion device, the second periodically domain-inverted regions 3a react to generate the higher harmonic waves P2a. Alternatively, when the oscillating wavelength is longer than the phase-matched wavelength of the light wavelength inversion device, the third periodically domain-inverted regions 3b react to generate the higher harmonic waves P2b. The respectively generated higher harmonic waves P2a and P2b are diffracted by the diffraction gratings 17a and 17b and incident upon the detectors 28a and 28b. Those higher harmonic waves P2a and P2b are converted into electric signals by the detectors 28a and 28b.

Figure 13A:
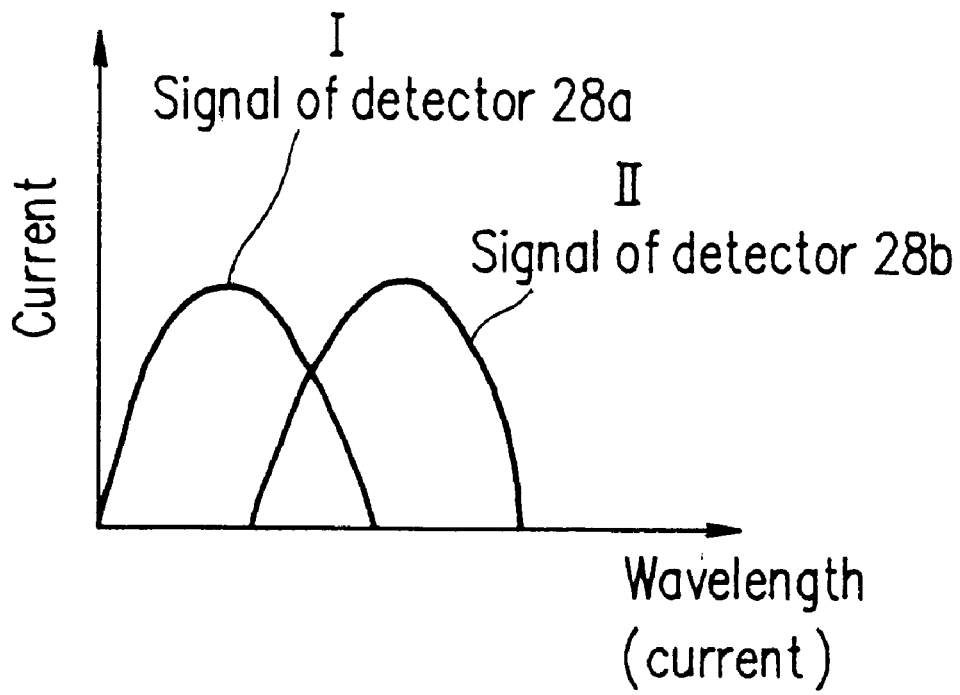
FIG. 13A is a graph showing output electric signals from a detector when the oscillating wavelength of a semiconductor laser is changed in the short wavelength laser beam source in Embodiment 5 of the present invention.

FIG. 13A shows output electric signals (output current values) of the detectors 28a and 28b in the case where the wavelength of the DBR semiconductor laser is changed. Here, assuming that the signal of the detector 28a is I, and the signal of the detector 28b is II, the differential output thereof is I-II.

Figure 13B:
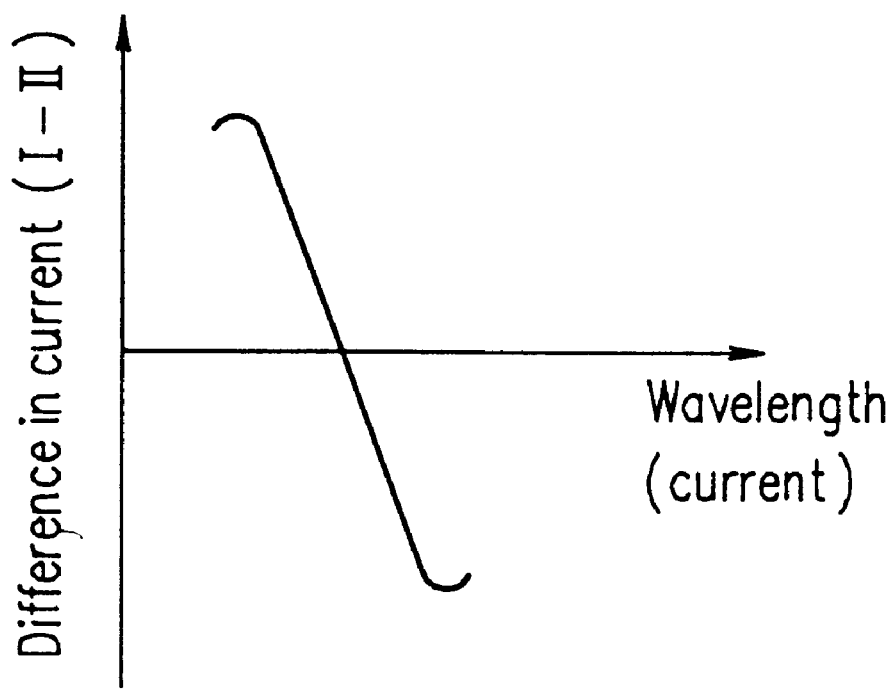
FIG. 13B is a graph showing a differential output when the oscillating wavelength of a semiconductor laser is changed in the short wavelength laser beam source in Embodiment 5 of the present invention.

FIG. 13B shows a differential output I-II in the case where the oscillating wavelength of the semiconductor laser is controlled with an applied current. In actual control, the oscillating wavelength is controlled with an applied current so that the fluctuation of the differential output I-II is within ±2%. Because of this, the value of the output of the higher harmonic waves can always be kept in the vicinity of a peak value. Specifically, when temperature changes in the range of 5 to 70° C., the output of the higher harmonic waves is fluctuated, for example, within ±1%.

As described above, the output of the higher harmonic waves can be simply and sufficiently stabilized by using the differential output. The conversion efficiency at which the fundamental waves P1 are converted into the higher harmonic waves P2 is 5% with respect to an input of 60 mW. The first periodically domain-inverted regions 3 for obtaining an actual output of higher harmonic waves and the second and third periodically domain-inverted regions 3a and 3b used for differential detection can be produced on the identical substrate 1 with the identical mask by the identical process. Therefore, the relationship between the phase-matched wavelengths of the periodically domain-inverted regions 3, 3a, and 3b is constant, and the oscillating wavelength is readily fixed to a peak of the output of the higher harmonic waves by the differential detection.

In the above description, the oscillating wavelength of the semiconductor laser is changed; however, even when the phase-matched wavelength of the light wavelength conversion device is changed by regulating the conditions of temperature and an electric field, similar effects can be obtained.

Embodiment 6

Figure 14:
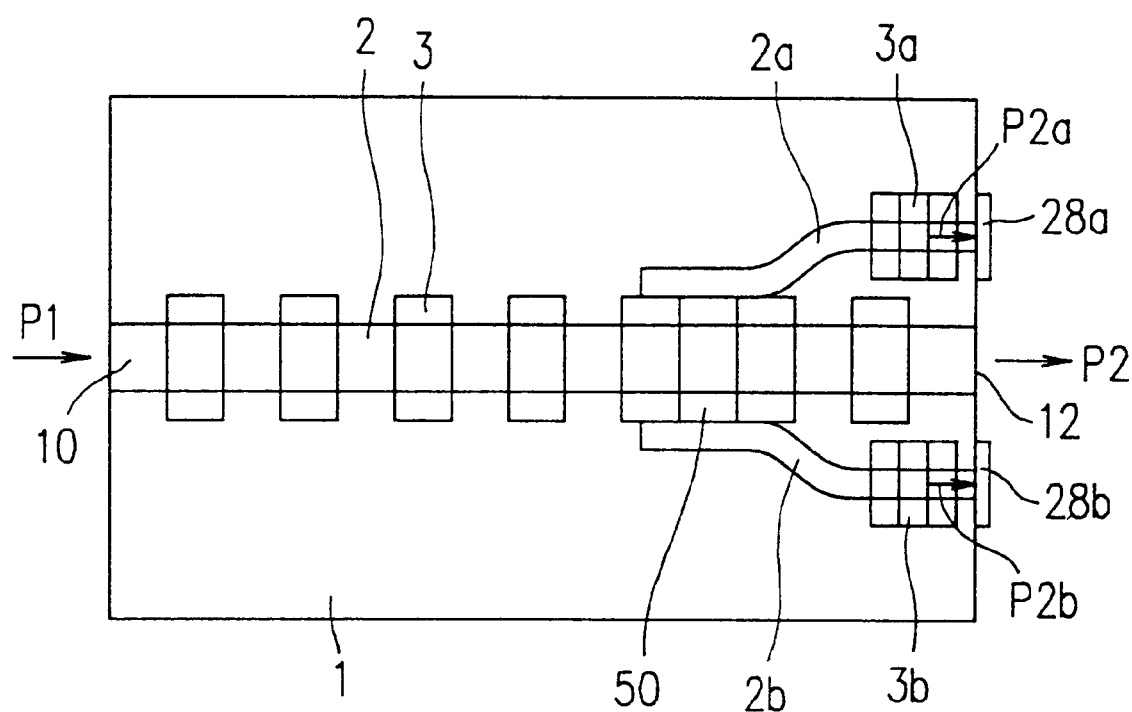
FIG. 14 is a plan view showing a structure of a light wavelength conversion device included in a short wavelength laser beam source in Embodiment 6 of the present invention.

A short wavelength laser beam source in Embodiment 6 of the present invention will be described. FIG. 14 is a plan view showing a structure of a light wavelength conversion device 22e used for the short wavelength laser beam source of this embodiment.

In this embodiment, an optical waveguide type light wavelength conversion device 22e is used as the one included in a short wavelength laser beam source. In the light wavelength conversion device 22e, periodically domain-inverted regions 3 are formed in a LiTaO$_3$ substrate 1 and an optical waveguide 2 is formed by proton exchange. Fundamental waves P1 incident through an incident face 10 are converted into higher harmonic waves P2 while propagating through the optical waveguide 2 and output from an output face 12.

As a control method for stabilizing the output of the higher harmonic waves P2 to be output, a method of differential detection is used in the light wavelength conversion device 22e. For this purpose, in the light wavelength conversion device 22e, second periodically domain-inverted regions 3a having a short period (period: Λ1) and third periodically domain-inverted regions 3b having a long period (period: Λ2) are formed in portions closer to the incident face 10 in addition to the first periodically domain-inverted regions 3 performing ordinary wavelength conversion. Specifically, three kinds of the periodically domain-inverted regions 3a, 3b, and 3 respectively having different periods are provided. The relationship between the periods is Λ1<Λ<Λ2.

Furthermore, branch optical waveguides 2a and 2b are formed on the second and third periodically domain-inverted regions 3a and 3b, respectively. Fundamental waves P1 are coupled to the branch optical waveguides 2a and 2b via a directional coupler 50. Higher harmonic waves P2a and P2b, which are generated based on the fundamental waves P1 propagating through the branch optical waveguides 2a and 2b, are output outside of a substrate 1. Furthermore, detectors 28a and 28b are provided on the side surface of the substrate 1 so as to allow the diffracted higher harmonic waves P2a and P2b to be incident thereupon.

Although not shown in FIG. 14, as a semiconductor laser, a DBR semiconductor laser having a wavelength variable function is used. The fundamental waves P1 emitted from the semiconductor laser are incident upon the optical waveguide 2 of the light wavelength conversion device 22e. The fundamental waves P1 incident upon the optical waveguide 2 are converted into higher harmonic waves P2 by the periodically domain-inverted regions 3. The converted higher harmonic waves P2 propagate through the optical waveguide 2 and output outside from an output face 12.

On the other hand, the fundamental waves P1 which are not converted are coupled to the branch optical waveguides 2a and 2b via the directional coupler 50. The fundamental waves P1 propagating through the branch optical waveguides 2a and 2b are converted into the higher harmonic waves P2a and P2b by the second and third periodically domain-inverted regions 3a and 3b provided at the ends of the optical waveguides 2a and 2b.

A region where the second periodically domain-inverted regions 3a (period: Λ1) are formed has a length of 1 mm, a phase-matched wavelength of 861 nm, and a wavelength half value width of 1 nm. A region where the third periodically domain-inverted regions 3b (period: Λ2) are formed has a length of 1 mm, a phase-matched wavelength of 862 nm, and a wavelength half value width of 1 nm. A region where the first periodically domain-inverted regions 3 are formed has a length of 9 mm, a phase-matched wavelength of 861.5 nm, and a wavelength half value width of 0.1 nm.

As described in the previous embodiment, when the oscillating wavelength of the semiconductor laser is matched with the phase-matched wavelength of the light wavelength inversion device, the first periodically domain-inverted regions 3 react to generate the higher harmonic waves P2, which are output from the output face 12. However, when the oscillating wavelength is shorter than the phase-matched wavelength of the light wavelength inversion device, the second periodically domain-inverted regions 3a react to generate the higher harmonic waves P2a. Alternatively, when the oscillating wavelength is longer than the phase-matched wavelength of the light wavelength inversion device, the third periodically domain-inverted regions 3b react to generate the higher harmonic waves P2b. The respectively generated higher harmonic waves P2a and P2b are incident upon the detectors 28a and 28b and converted into electric signals therein. Thus, a differential signal is obtained from signals detected by the detectors 28a and 28b based on the same principle as that of the previous embodiment. The oscillating wavelength is controlled with an applied current so that the fluctuation of the differential signal is within ±2%, whereby the value of the output of the higher harmonic waves can be always kept in the vicinity of a peak value. Specifically, when temperature changes in the range of 5 to 70° C., the output of the higher harmonic waves is fluctuated, for example, within ±1%.

The conversion efficiency at which the fundamental waves P1 are converted into the higher harmonic waves P2 is 7% with respect to an input of 60 mW. When the periodically domain-inverted regions 3a and 3b for differential detection are formed on the side of the output face 12 as in this embodiment, the "used" fundamental waves which have already been subjected to the conversion into higher harmonic waves can be utilized; therefore, the conversion efficiency are not affected.

In the above description, the oscillating wavelength of the semiconductor laser is changed; however, even when the phase-matched wavelength of the light wavelength conversion device is changed by regulating the conditions of temperature and an electric field, similar effects can be obtained.

Embodiment 7

Figure 15:
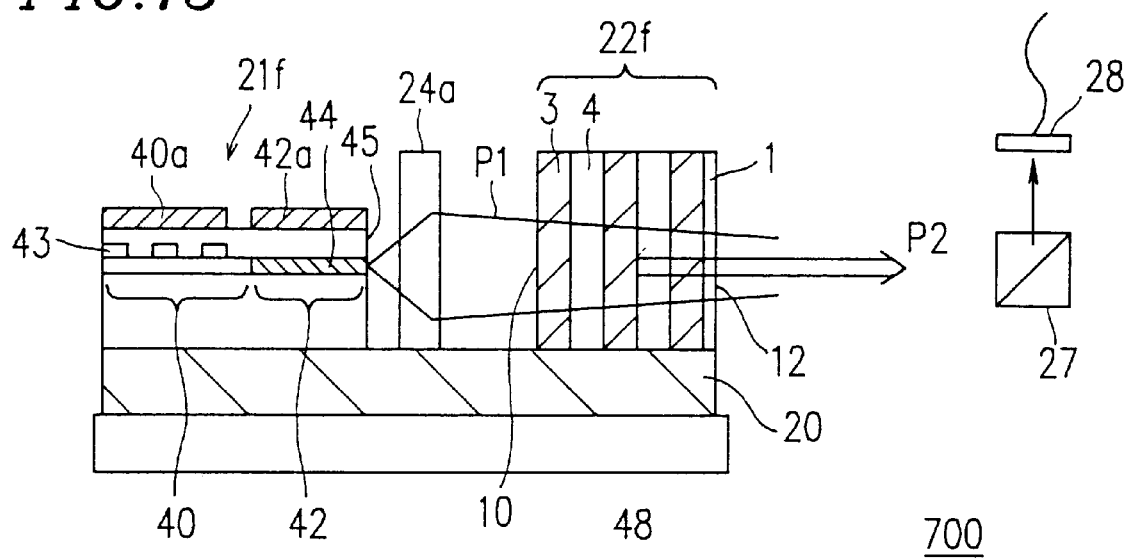
FIG. 15 is a cross-sectional view showing a structure of a short wavelength laser beam source in Embodiment 7 of the present invention.

A short wavelength laser beam source in Embodiment 7 of the present invention will be described. FIG. 15 is a cross-sectional view showing a structure of a short wavelength laser beam source 700 of this embodiment.

The short wavelength laser beam source 700 includes a light wavelength conversion device 22f in which periodically domain-inverted regions 3 are formed in a substrate 1 made of $LiTaO_3$, which is non-linear optical crystal. Furthermore, in the light wavelength conversion device 22f, an optical waveguide is not formed on its surface where periodically domain-inverted regions are formed. More specifically, the light wavelength conversion device 22f of this embodiment is a bulk-type device. The periodically domain-inverted regions 3 can be formed by an electric field application or the like.

The short wavelength laser beam source 700 includes a DBR semiconductor laser 21f having a wavelength variable portion. The DBR semiconductor laser 21f and the light wavelength conversion device 22f are fixed on a base member 20 made of Al. Fundamental waves P1 emitted from the semiconductor laser 21f are collimated by a collimator lens 24a and is incident upon the light wavelength conversion device 22f through an incident face 10.

The fundamental waves P1 incident upon the light wavelength conversion device 22f are converted into higher harmonic waves P2 in the domain-inverted region 3 having a phase-matched length L. Then, the power of the higher harmonic waves P2 is amplified in the subsequent non-domain-inverted region 4 also having a phase-matched length L. The higher harmonic waves P2 thus amplified in the light wavelength conversion device 22f are output from an output face 12.

The wavelength at which the higher harmonic waves are generated (phase-matched wavelength) is determined by quasi-phase match based on the refractive index of nonlinear optical crystal and the period of the domain-inverted regions 3. Because of this, the change in ambient temperature causes the change in the refractive index of the non-linear optical crystal; as a result, the phase-matched wavelength changes.

Next, the DBR semiconductor laser 21f will be described. The DBR semiconductor laser 21f includes a light-emitting portion 42 and a DBR portion 40. The light-emitting portion 42 and the DBR portion 40 can be independently controlled by electrodes 42a and 40a, respectively. When a current is injected into the light-emitting portion 42 through the electrode 42a, an active layer 44 emits light. When the injected current exceeds an oscillating threshold, the reflection caused by a front cleavage face 45 of the semiconductor laser 21f and a diffraction grating 43 provided on the DBR portion 40 allows oscillation to occur, whereby a laser oscillates.

The change in the current injected into the DBR portion 40 of the semiconductor laser 21f causes the change in the refractive index; as a result, the feedback wavelength changes. By utilizing this principle, the DBR portion 40 can be operated as a wavelength variable portion, whereby the oscillating wavelength of a laser can be varied.

Next, a method for stabilizing the output of higher harmonic waves will be described.

The short wavelength laser beam source 700 is entirely mounted on a Peltier device 48 so that its temperature is always kept constant irrespective of the change in ambient temperature. However, when the short wavelength laser beam source 700 is used over a long period of time, the quasi-phase-matched wavelength of the light wavelength conversion device 22f or the oscillating wavelength of the semiconductor laser 21f changes; as a result, the quasi-phase-matched wavelength is shifted from the oscillating wavelength. In this case, by changing the oscillating wavelength of the DBR semiconductor laser 21f, the oscillating wavelength of the semiconductor laser 21f can be matched with the phase-matched wavelength of the light wavelength conversion device 22f.

The higher harmonic waves P2 from the light wavelength conversion device 22f are divided by a beam splitter 27, and part of them can be monitored by a Si detector 28. According to this structure, a current to be applied to the electrode 40a can be regulated by using the detection results of a detector 28 so that the output of the higher harmonic waves always takes a maximum value; thus, the output of the higher harmonic waves P2 can be stably kept at an intended value.

The structure of the detector 28 is not limited to detection of the higher harmonic waves P2 obtained through the output face 12 as shown in FIG. 15. Alternatively, part of the higher harmonic waves converted in the light wavelength conversion device 22f is output outside through the incident face 10 of the light wavelength conversion device 22f. Thus, the detector 28 can be positioned above a gap between the semiconductor laser 21f and the light wavelength conversion device 22f so as to detect the higher harmonic waves output through the incident face 10 of the light wavelength conversion device 22f.

According to this embodiment, the fluctuation of the output of the higher harmonic waves can be suppressed within ±3% at a temperature in the range of 0 to 60° C. The conversion efficiency at which the fundamental waves are converted into the higher harmonic waves is 0.5% with respect to an input of 30 mW, and blue light with an output of 1.5 mW can be obtained. The bulk-type light wavelength conversion device 22f as included in the short wavelength laser beam source 700 of this embodiment enables optical path to be aligned easily and is resistant to mechanical vibration; thus, the device 700 is practical.

Next, the DBR semiconductor laser 21f is RF-driven in the structure of the short wavelength laser beam source 700 of FIG. 15. Specifically, a sine wave current with a frequency of 800 MHz is applied to the electrode 40a. Because of this, the output of the higher harmonic waves P2 with a power of 2 mW can be obtained with respect to an average power of 100 mW of the fundamental waves P1.

Since the conversion efficiency of the light wavelength conversion device is proportional to a power of the fundamental waves, the conversion efficiency can be improved by RF-driving the semiconductor laser 21f and inputting the fundamental waves P1 into the light wavelength conversion device 22f in the pulse train. The DBR semiconductor laser 21f does not show disturbance of a vertical mode in an RF drive and an effective wavelength-conversion is performed.

The RF drive of the semiconductor laser is not limited to the case using the bulk-type light wavelength conversion device 22f as in this embodiment and can be applied to the structure of a short wavelength laser beam source including an optical waveguide type light wavelength conversion device. The coarse control and fine control described in Embodiment 4 or the differential detection described in Embodiment 5 can be applied to the structure of the short wavelength laser beam source 700 including the bulk-type light wavelength conversion device 22f in this embodiment.

Embodiment 8

Figure 16:
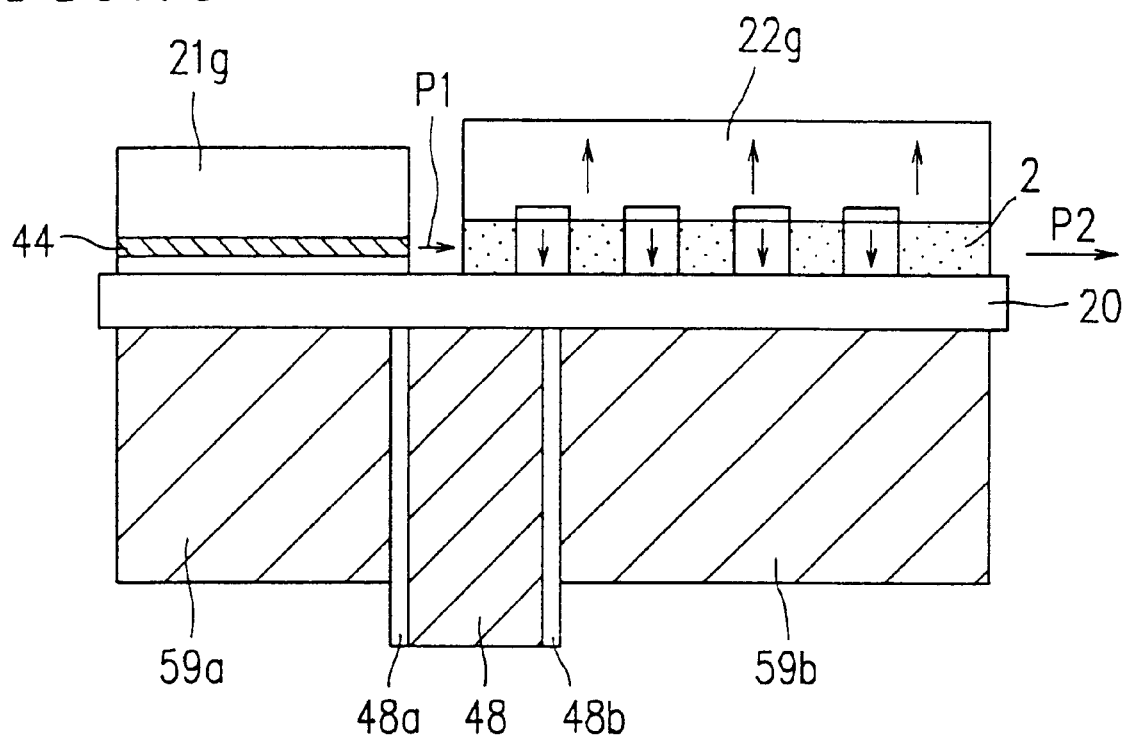
FIG. 16 is a cross-sectional view showing a structure of a short wavelength laser beam source in Embodiment 8 of the present invention.

Next, the short wavelength laser beam source in Embodiment 8 of the present invention will be described. FIG. 16 is a cross-sectional view showing a structure of a short wavelength laser beam source 800 of this embodiment.

In the short wavelength laser beam source 800 shown in FIG. 16, the temperature of the short wavelength laser beam source 800 is regulated by a Peltier device 48. However, the arrangement of the short wavelength laser beam source 800 is different from that of the short wavelength laser beam source 700 of Embodiment 7 shown in FIG. 15. Specifically, a copper block 59a is disposed so as to face a DBR semiconductor laser 21g with a base member 20 interposed therebetween. Likewise, a copper block 59b is disposed so as to face a light wavelength conversion device 22g with the base member 20 interposed therebetween. The base member 20 is typically made of brass and has a thickness of 0.5 mm, for example. Because of this, heat is not likely to be transmitted from the DBR semiconductor laser 21g to the light wavelength conversion device 22g.

A first face 48a of the Peltier device 48 is in contact with the copper block 59a, and a second face 48b is in contact with the copper block 59b. When a current is applied to the Peltier device 48, the first and second faces 48a and 48b exhibit temperature characteristics opposite to each other. For example, in the case where the first face 48a shows a heating function which generates heat, the second face 48b shows a cooling function which absorbs heat. Because of this, the temperature of the semiconductor laser 21g in contact with the first face 48a of the Peltier device 48 via the copper block 59a and the temperature of the light wavelength conversion device 22g in contact with the second face 48b via the copper block 59b can be regulated by controlling a current to be applied to the Peltier device 48.

For example, when the temperature of the copper block 59a is changed from about 5° C. to about 55° C. via a room temperature of 30° C., the temperature of the copper block 59b changes from about 10° C. to about 50° C. As a result, the oscillating wavelength of the semiconductor laser 21g can be varied in a range, for example, of 2.6 nm while the phase-matched wavelength of the light wavelength conversion device 22g can be varied in a range, for example, of 2.0 nm. Thus, the wavelength can be regulated in a range of 4.6 nm in total. The short wavelength laser beam source 700 shown in FIG. 15 is entirely disposed on the identical face of the Peltier device 48 via the substrate 20. In this case, the wavelength is varied in a range of about 0.6 nm. Thus, according to the structure of this embodiment, the wavelength can be controlled in an 8 times wider range.

Furthermore, the oscillating wavelength of the DBR semiconductor laser 21g and the phase-matched wavelength of the light wavelength conversion device 22g continuously change with temperature. Because of this, stable and smooth tuning of the wavelength can be performed.

Embodiment 9

Figure 17:
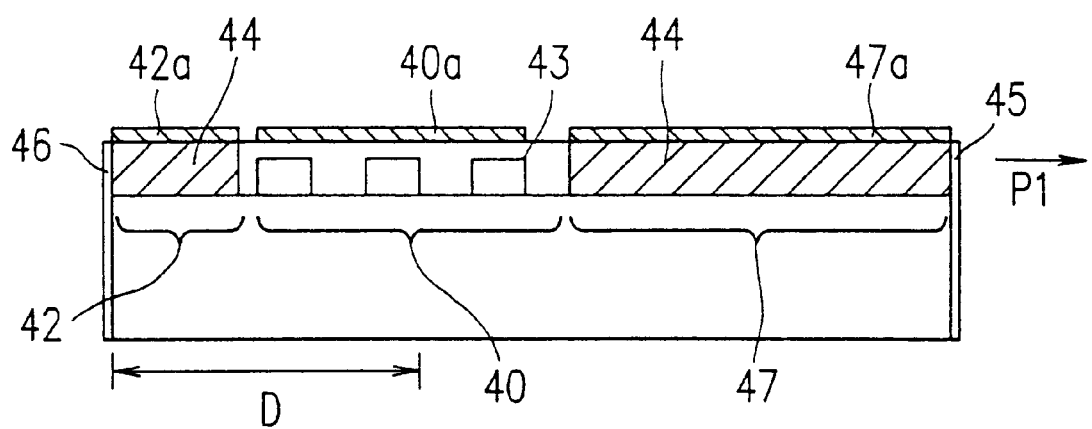
FIG. 17 is a cross-sectional view showing a structure of a semiconductor laser included in a short wavelength laser beam source in Embodiment 9 of the present invention.

A short wavelength laser beam source in Embodiment 9 of the present invention will be described. FIG. 17 is a cross-sectional view showing a structure of a semiconductor laser included in the short wavelength laser beam source of this embodiment.

The short wavelength laser beam source includes a light wavelength conversion device in which periodically domain-inverted regions are formed on a substrate made of $KNbO_3$ which is non-linear optical crystal. $KNbO_3$ is a material which phase-matches the wavelength of the semiconductor laser having an oscillating wavelength of 800 nm. The periodically domain-inverted regions can be formed by ion implantation, or the like.

The short wavelength laser beam source of this embodiment uses a DBR semiconductor laser 21h having a wavelength variable portion. The DBR semiconductor laser 21h is fixed on a base member 20 made of Al. Fundamental waves P1 emitted from the semiconductor laser 21h are collimated by a collimator lens, focused by a focus lens through a semi-wavelength plate, and is incident upon an optical waveguide of the light wavelength conversion device (not shown in FIG. 17) through an incident face. The semi-wavelength plate is inserted so as to rotate the polarization direction of the fundamental waves P1 by 90° and match it with the polarization direction of the optical waveguide.

The fundamental waves P1 incident upon the light wavelength are converted into higher harmonic waves in the domain-inverted region having a phase-matched length L. Then, the power of the higher harmonic waves is amplified in the subsequent non-domain-inverted region also having a phase-matched length L. The higher harmonic waves thus amplified in the optical waveguide are output from an output face.

In this embodiment, as described later, in order to simplify the control, the stabilization of the higher harmonic waves is realized only by the application of a current.

Next, the DBR semiconductor laser 21h will be described.

The DBR semiconductor laser 21h includes a light-emitting portion 42, a DBR portion 40, and an amplifier portion 47. The light-emitting portion 42, the DBR portion 40, and the amplifier portion 47 can be independently controlled by electrodes 42a, 40a, and 47a, respectively. When a current is injected into the light-emitting portion 42 through the electrode 42a, an active layer 44 emits light. When the injected current exceeds an oscillating threshold, the reflection caused by a back cleavage face 46 of the semiconductor laser 21h and a diffraction grating 43 provided on the DBR portion 40 allows oscillation to occur, whereby a laser oscillates.

The change in the current injected into the DBR portion 40 of the semiconductor laser 21h causes the change in the refractive index; as a result, the feedback wavelength changes. By utilizing this principle, the DBR portion 40 can be operated as a wavelength variable portion, whereby the oscillating wavelength of a laser can be varied.

Light generated at the light-emitting portion 42 is emit after being amplified by the amplifier portion 47. When non-reflective coating is provided to a front cleavage face 45 of the semiconductor laser 21h, the reflection on the cleavage face 45 can be reduced to 0.01%. Because of this, a complex mode is not established.

In this embodiment, an effective resonator length (cavity length) D between the back cleavage face 46 of the semiconductor laser 21h and the effective reflection face of the DBR portion 40 is set at 150 μm, and the vertical mode interval is set at 0.7 nm. Because of this, in a range of 0.7 nm, the wavelength can be continuously controlled only by controlling a current to be applied to the electrode 40a without causing the mode hopping. The DBR portion 40 has a sufficient reflection wavelength width of 1 nm.

Figure 18:
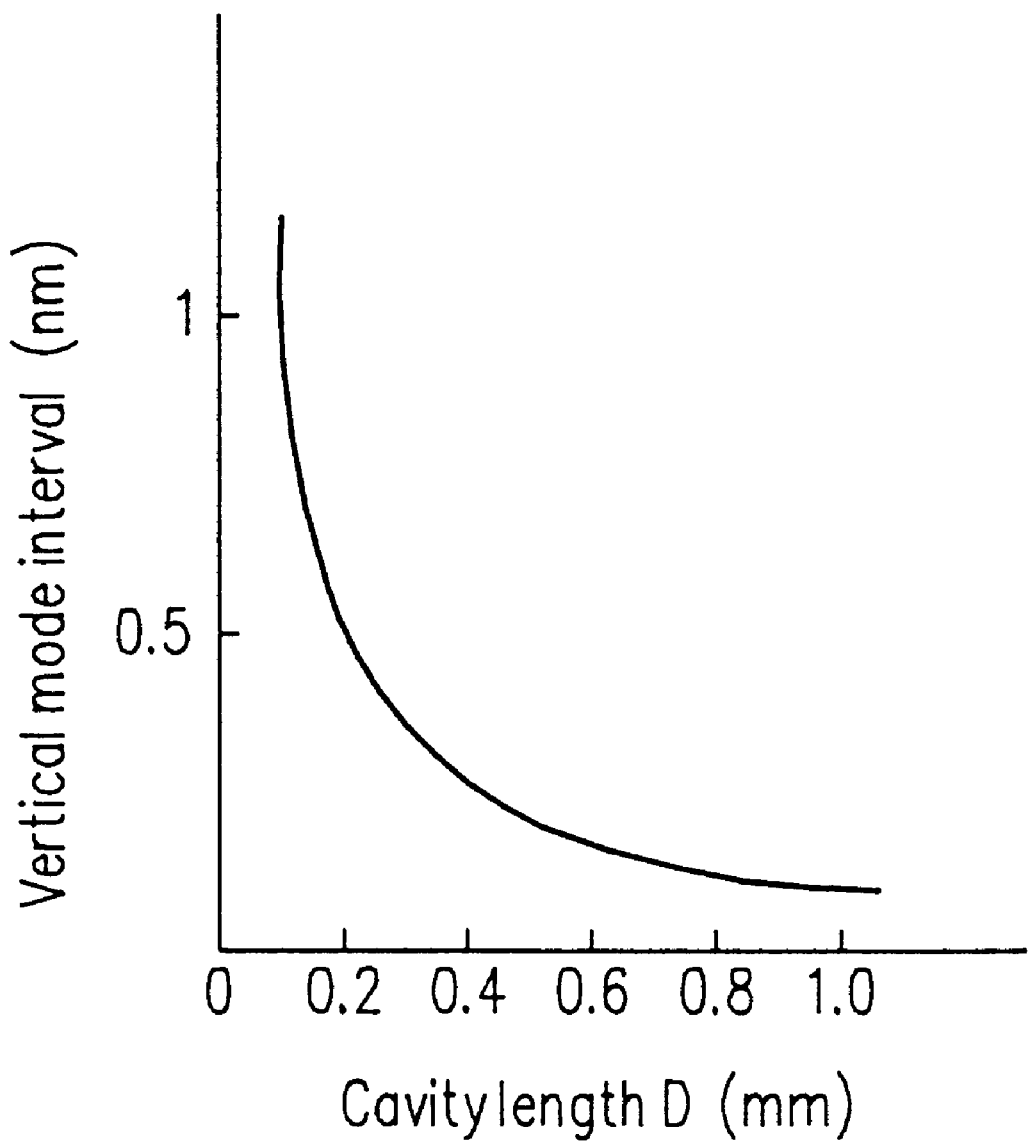
FIG. 18 is a graph showing the relationship between the effective resonator length (cavity length) and the vertical mode interval.

FIG. 18 is a graph showing the relationship between the cavity length D and the vertical mode interval. As shown in FIG. 18, the cavity length D is inversely proportional to the vertical mode interval. The wavelength can be changed without mode hopping within the vertical mode interval. Furthermore, when the vertical mode interval is widened by decreasing the cavity length D, the adjustable range of the wavelength can be broadened.

In order to compensate the fluctuation of the phase-matched wavelength of the light wavelength conversion device in a temperature range of 20° C., the wavelength is desirably changed in a range of 0.5 nm. As is clear from FIG. 18, the cavity length D is desirably set at 200 μm or less. The cavity length D is more desirably set at 100 μm or less, because the wavelength corresponding to a temperature range of 40° C. can be regulated.

In general, when the cavity length D becomes shorter, a power of a laser beam to be oscillated decreases. In this embodiment, the semiconductor laser 21h is provided with the amplifier portion 47, whereby a weak oscillating laser beam is amplified.

Next, a method for stabilizing the output of higher harmonic waves will be described.

When ambient temperature changes, the phase-matched wavelength of the light wavelength conversion device changes. By changing the oscillating wavelength of the DBR semiconductor laser 21h in the same way as the above-mentioned embodiments, the oscillating wavelength of the laser 21h can be matched with the thus changed phase-matched wavelength in the light wavelength conversion device.

At this time, the output of higher harmonic waves from the light wavelength conversion device is divided by a beam splitter, and a part of the output can be monitored by a Si detector. According to this structure, a value of a current to be applied to the electrodes 40a can be regulated so that the output of higher harmonic waves always takes the highest value by using the detection results of the detector, and the output of the higher harmonic waves can be stably maintained at an intended value.

For example, when the current to be applied to the electrode 40a is changed by 40 mA, the oscillating wavelength changes by about 0.6 nm, for example. Thus, the oscillating wavelength of the semiconductor laser can be changed in a wide range in accordance with the change in the quasi-phase-matched wavelength of the light wavelength conversion device.

Specifically, when the temperature changes in the range of 15 to 45° C., the fluctuation of the output of higher harmonic waves is within ±3%. In this embodiment, the conversion efficiency at which the fundamental waves are converted into the higher harmonic waves is 5% with respect to an input of 40 mW.

Figure 19:
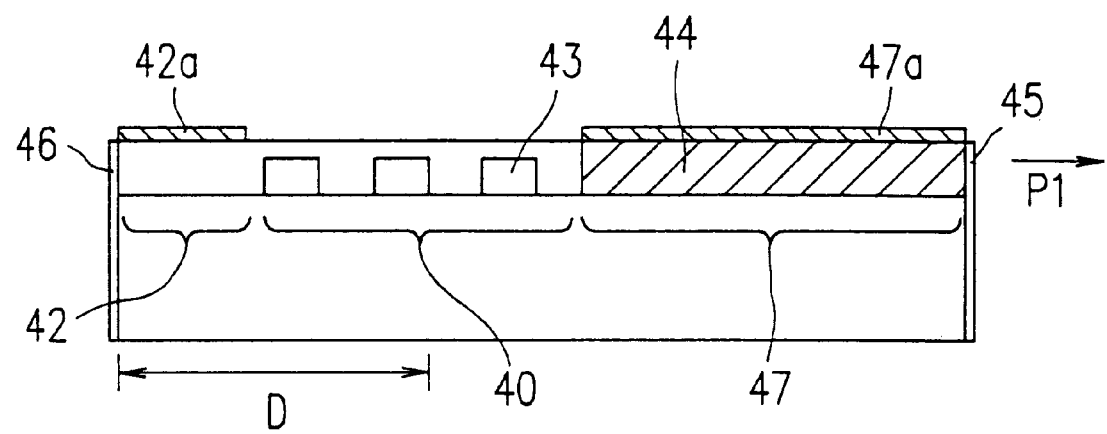
FIG. 19 is a cross-sectional view showing another structure of a semiconductor laser included in the short wavelength laser beam source in Embodiment 9 of the present invention.

FIG. 19 is a cross-sectional view of a DBR semiconductor laser 21j having a structure in which the electrode 40a is not formed on the DBR portion 40 as a modified example of the short wavelength laser beam source of this embodiment. In this structure, a current is applied to the electrode 42a provided on the light-emitting portion 42 to generate laser oscillation, and the amount of a current to be applied to the electrode 42a is changed to regulate the oscillating wavelength. Specifically, the light-emitting portion 42, which has a light-emitting function involved in the application of a current to the electrode 42a, further has a phase control function of regulating the oscillating wavelength involved in the control of the amount of the applied current. The output level of the laser beam to be oscillated is regulated by the control of the amount of the current to be applied to the electrode 47a provided on the amplifier portion 47.

In the structure of the semiconductor laser of this embodiment shown in FIG. 17 or 19, a concave portion is provided between the DBR portion 40 and a cleavage face to form a reflector, whereby a short resonator can be formed. Such a structure can realize a resonator having a very short cavity length D.

Embodiment 10

Figure 20:
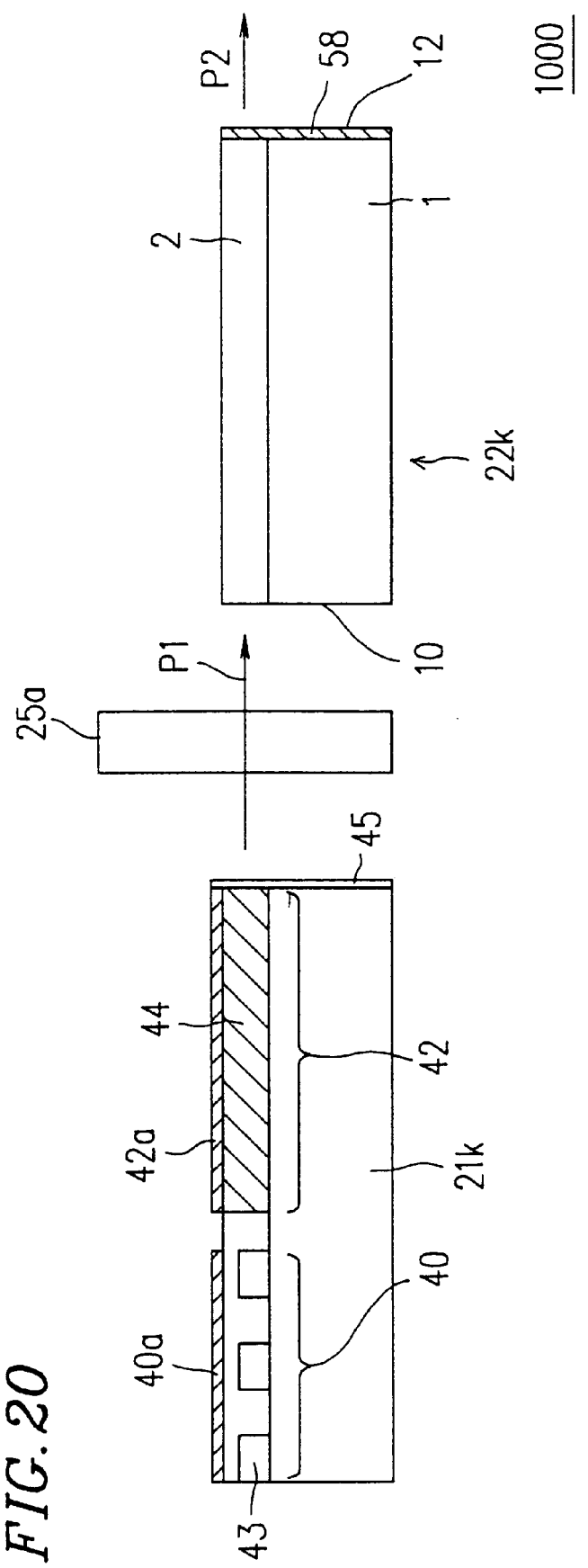
FIG. 20 is a cross-sectional view showing a structure of a short wavelength laser beam source in Embodiment 10 of the present invention.

A short wavelength laser beam source in Embodiment 10 of the present invention will be described. FIG. 20 is a cross-sectional view showing a structure of a short wavelength laser beam source 1000 of this embodiment.

The short wavelength laser beam source 1000 includes a light wavelength conversion device 22k in which periodically domain-inverted regions (not shown) are formed on the surface of a substrate 22 made of nonlinear optical crystal, $LiTaO_3$. Furthermore, an optical waveguide 2 is formed by proton exchange on the surface of the light wavelength conversion device 22k on which the periodically domain-inverted regions 3 are formed.

The short wavelength laser beam source 1000 also includes a DBR semiconductor laser 21k having a wavelength variable portion. In this embodiment, a reflector 58 is formed on an output face 12 of the light wavelength conversion device 22k, and the light reflected therefrom is fed back to an active layer 44 to control the oscillating wavelength. Thus, a vertical mode interval can be remarkably decreased.

The DBR semiconductor laser 21k is fixed on a base member (not shown). Fundamental waves P1 emitted from the semiconductor laser 21k are collimated by a collimator lens 25a and is incident upon the optical waveguide 2 of the light wavelength conversion device 22k through an incident face 10.

The fundamental waves P1 incident upon the light wavelength 2 are converted into higher harmonic waves P2 in the domain-inverted region having a phase-matched length L. Then, the power of the higher harmonic waves P2 is amplified in the subsequent non-domain-inverted region also having a phase-matched length L. The higher harmonic waves P2 thus amplified in the optical waveguide 2 are output from an output face 12.

Next, the DBR semiconductor laser 21k will be described.

The DBR semiconductor laser 21k includes a light-emitting portion 42 and a DBR portion 40. The light-emitting portion 42 and the DBR portion 40 can be independently controlled by electrodes 42a and 40a, respectively. When a current is injected into the light-emitting portion 42 through the electrode 42a, an active layer 44 emits light. When the injected current exceeds an oscillating threshold, the reflection caused by a reflector 58 provided on the light wavelength conversion device 22k and a diffraction grating 43 provided in the DBR portion 40 allows oscillation to occur, whereby a laser oscillates.

A non-reflective coating is provided on a front cleavage face 45 of the semiconductor laser 21k. The reflector 58 reflects fundamental waves having a wavelength of 800 nm by 98%, and transmits higher harmonic waves having a wavelength of 400 nm by 95%.

Since the refractive index is changed by changing a current to be injected into the DBR portion 40 of the semiconductor laser 21k, the wavelength to be fed back is changed. By using this principle, the DBR portion 40 can be operated as a wavelength variable portion, whereby the oscillating wavelength of a laser can be varied.

In the structure of this embodiment, a cavity length D which is a distance between the reflector 58 and the effective reflection face of the DBR portion 40 is set at 11 mm, and a vertical mode interval is set at 0.01 nm. The wavelength can be apparently and continuously changed by decreasing the vertical mode interval. The allowable wavelength half value width of the light wavelength conversion device 22k is 0.2 nm.

The light wavelength conversion device 22k of this embodiment supplies the stable output of the higher harmonic waves at a low noise in a temperature range of 60° C. In this embodiment, the reflector 58 is provided on the output side of the light wavelength conversion device 22k. Because of this structure, the fundamental waves can be reflected by the reflector 58 after propagating through the light wavelength conversion device 22k; therefore, a power can be effectively used when the fundamental waves are converted into the higher harmonic waves. However, the reflector 58 can be provided on the incident side of the light wavelength conversion device 22k.

As described in this embodiment, when the allowable wavelength half value width of the light wavelength conversion device 22k is wider than the vertical mode interval of the semiconductor laser 21k, the higher harmonic waves are always output. This will be described with reference to FIG. 21.

Figure 21:
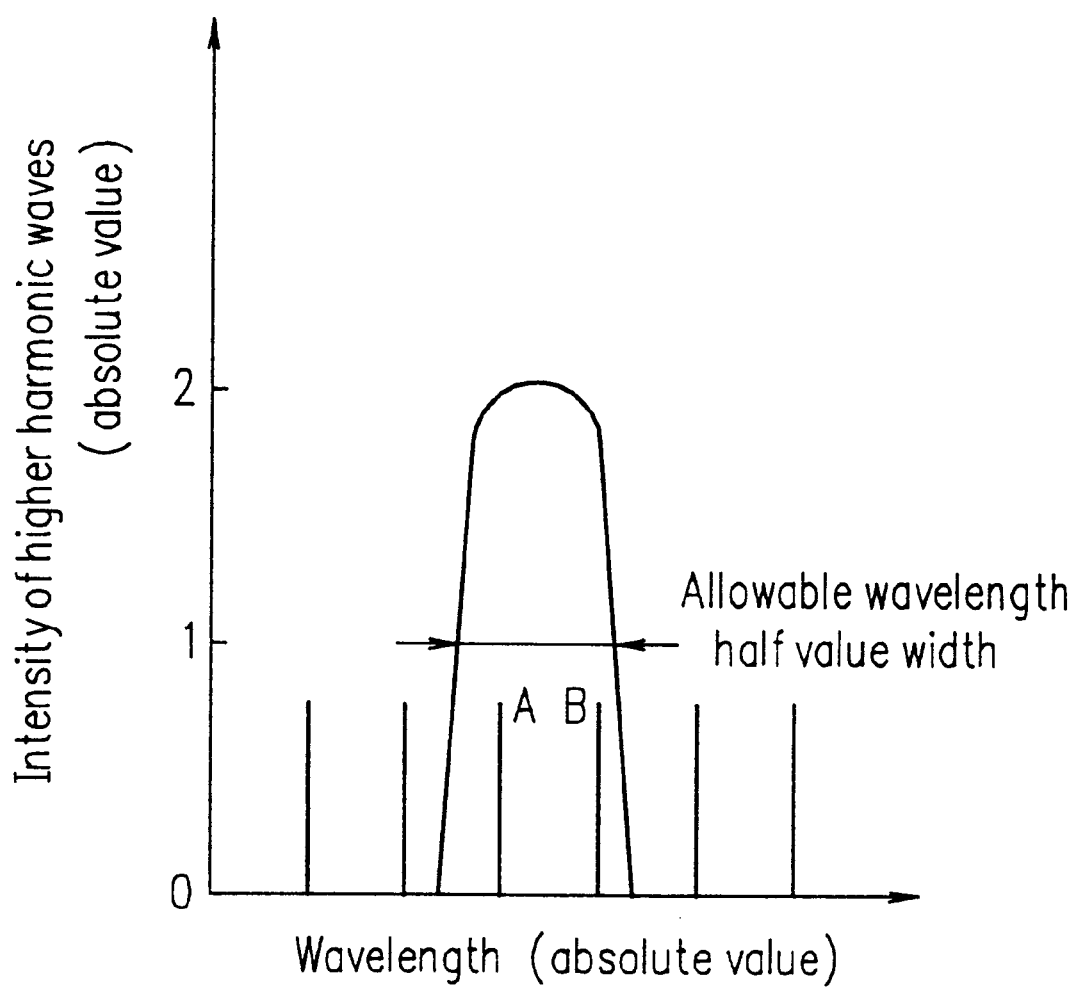
FIG. 21 is a graph showing the relationship between the vertical mode interval and the allowable wavelength width of higher harmonic waves.
Figure 22:
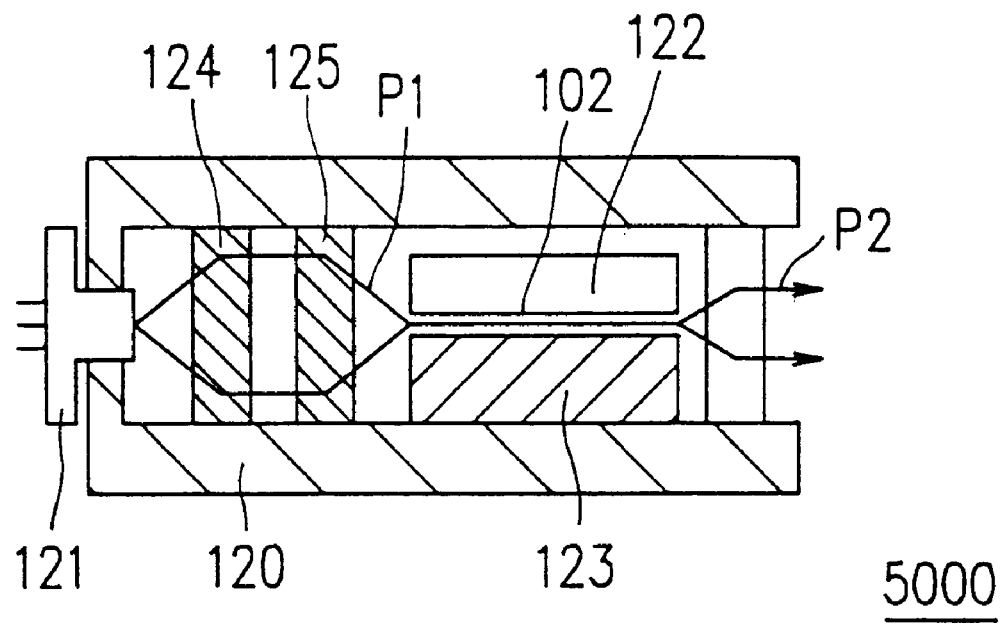
FIG. 22 is a cross-sectional view showing a structure of a conventional short wavelength laser beam source.
Figure 23A:
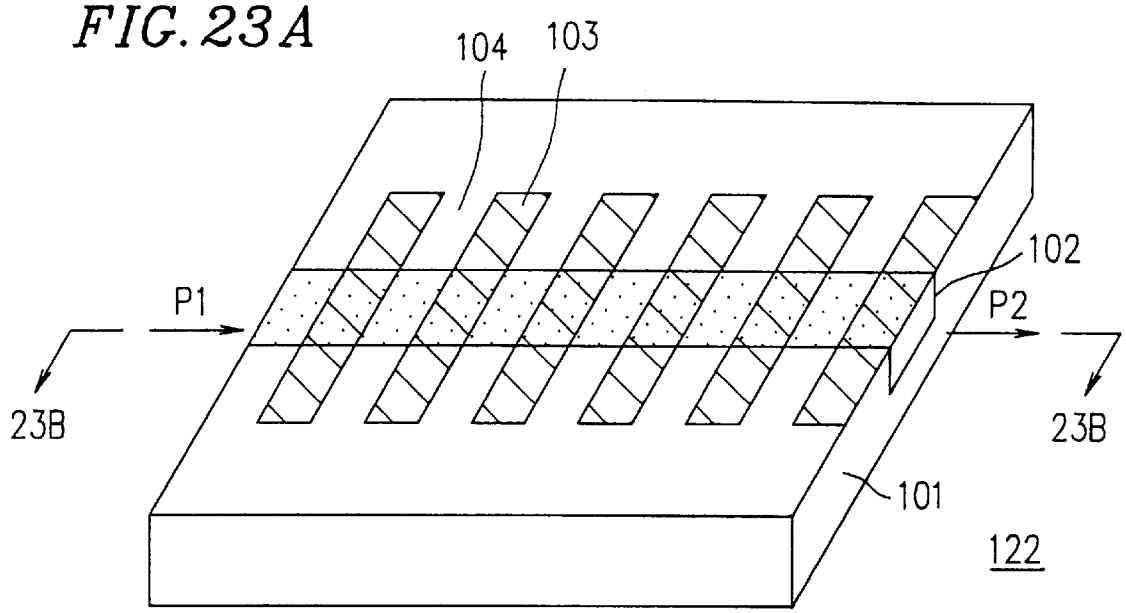
FIG. 23A is a perspective view showing a structure of a conventional light wavelength conversion device.
Figure 23B:
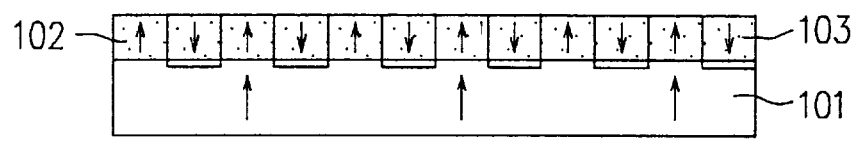
FIG. 23B is a cross-sectional view taken along a line 23B—23B of FIG. 23A.

FIG. 21 is a graph schematically showing the relationship between the vertical mode of the semiconductor laser and the higher harmonic waves intensity of the light wavelength conversion device. This figure shows the case where two vertical modes A and B are present in the allowable wavelength half value width. Irrespective of whether either of these two vertical modes A and B is selected, the output intensity of the light wavelength conversion device becomes 1 or more; however, the level of the intensity can be decreased by controlling the output of the semiconductor laser. Thus, the actual output of the light wavelength conversion device can be kept constant.

As described above, in order to make the allowable wavelength half value width of the light wavelength conversion device larger than the vertical mode interval of the semiconductor laser, a method for lengthening the cavity length D of the semiconductor laser is effective. Alternatively, a method for partially changing the period of the domain-inverted regions of the light wavelength conversion device is effective. According to the latter method, light wavelength conversion devices having an arbitrary allowable width can be realized by changing the period of the domain-inverted regions gradually or on a group basis in the length direction of the optical waveguide.

In the semiconductor lasers in the aforementioned embodiments, it is preferred that the light-emitting portion is positioned on the side closer to the light wavelength conversion device, and the DBR portion is positioned on the side far away from the light wavelength conversion device. This is because such an arrangement decreases the loss of a laser beam incident upon the light wavelength conversion device.

A laser beam obtains a gain at the light-emitting portion; therefore, a power to be output can be made the best possible use when the light-emitting portion is positioned on the side closer to the output facet of the semiconductor laser, i.e., on the side closer to the light wavelength conversion device. Furthermore, a laser beam emitted from the light-emitting portion to the DBR portion is almost diffracted by the diffraction grating of the DBR portion. The diffraction efficiency can be freely set by appropriately setting the pitch of the diffraction grating. The diffraction grating is set at around 90%, for example.

When the DBR portion is positioned on the side closer to the light wavelength conversion device, and the light-emitting portion is positioned on the side far away from the light wavelength conversion device, a laser beam emitted from the light-emitting portion typically ends up being diffracted by about 90% before being incident upon the light wavelength conversion device and returning to the light-emitting portion. As a result, a laser beam is hardly output from the facet on the side of the DBR portion to the light wavelength conversion device.

Furthermore, when the light wavelength conversion device of the semiconductor laser is mounted on a metallic base member, the active layer of the semiconductor laser and the optical waveguide of the optical waveguide of the light wavelength conversion device are preferably positioned so as to be far away from the metallic substrate for the following reasons.

Specifically, it is required to provide a plurality of electrodes in semiconductor lasers; therefore, in order to facilitate the step of forming wirings to be connected to electrodes by wire bonding or the like, the electrodes are preferably positioned on the upper face of the semiconductor laser.

When a light wavelength conversion device is positioned so that its optical waveguide is directly in contact with the metallic substrate, optical loss occurs toward the metallic base member having a large refractive index. In order to avoid such optical loss, a protective film such as $SiO_2$ film should be formed between the base member and the light wavelength conversion device (optical waveguide). However, when the optical waveguide is positioned on the upper side, such a protective film can be omitted.

In the above-described embodiments, $LiTaO_3$ or $LiNbO_3$ is used as non-linear optical crystal. In place of these $KTP(KTiOPO_4)$; $KNbO_3$; $LiTaO_3$ or $LiNbO_3$ doped with MgO, Nb or Nd; and ferroelectrics such as $LiNb_{(1-x)}Ta_xO_3$ ($0 \leq X \leq 1$) which is mixed crystal of $LiTaO_3$ and $LiNbO_3$, can be used. Alternatively, organic non-linear optical crystal such as MNA and DAN can be used.

It is needless to say that the present invention can be applied to the case where a plurality of peaks are present in the output of the higher harmonic waves, the case where a predetermined output is required, etc.

As described above, according to the present invention, by slightly changing a drive current of a semiconductor laser, an oscillating wavelength can be changed to adjust to a phase-matched wavelength of a light wavelength conversion device (Secondary harmonic wave generation device= SHG). Usually, when ambient temperature changes, the phase-matched wavelength changes and conditions for establishing quasi-phase match of the light wavelength conversion device become unsatisfied; as a result, the output of higher harmonic waves cannot be obtained. In contrast to this, according to the present invention, even when the phase-matched wavelength changes, an oscillating wavelength λ of the semiconductor laser is changed to adjust to the phase-matched wavelength by changing the drive current, whereby conditions for obtaining the highest output of higher harmonic waves can be maintained.

In a DBR semiconductor laser, even when a current applied to an active layer is changed, an oscillating wavelength hardly changes; however, when a DBR portion is provided with a current injection function and a current is allowed to flow therein, a refractive index is changed to cause a change in a reflection wavelength. In this manner, an oscillating wavelength can be changed. More specifically, by changing the injection current to the DBR portion, the refractive index is changed so as to change the oscillating wavelength to be fed back. Thus, the oscillating wavelength of a laser can be changed to adjust to the quasi-phase-matched wavelength of the light wavelength conversion device.

Higher harmonic waves can be stably maintained by monitoring the output of higher harmonic waves and adjusting a current so that it always has the highest value. Even when the oscillating wavelength is shifted from the quasi-phase-matched wavelength, the conditions for establishing the quasi-phase match can be satisfied by applying a current, and hence, higher harmonic waves can be taken out at high efficiency.

Furthermore, according to the present invention, because of the above-mentioned structure, the refractive index changes efficiently with respect to the application of a current, and the output of higher harmonic waves can be modulated. More specifically, in the case where a phase is matched in the initial state, the refractive index is greatly changed by the application of a current, and the oscillating wavelength will shift from the phase-matched wavelength. By utilizing this principle, ON/OFF control of the output of higher harmonic waves can be performed depending upon the change in a current to be applied.

As described above, according to the method for stabilizing the output of higher harmonic waves of the present invention, the oscillating wavelength is controlled by changing a current of the semiconductor laser so as to match the oscillating wavelength with the quasi-phase-matched wavelength of the light wavelength conversion device. Thus, the output of higher harmonic waves can be easily stabilized.

Furthermore, the short wavelength laser beam source of the present invention is capable of generating higher harmonic waves easily and stably under the condition that the oscillating wavelength of the semiconductor laser is matched with the quasi-phase-matched wavelength of the light wavelength conversion device.

Still furthermore, the short wavelength laser beam source of the present invention is capable of preventing the wavelength of the semiconductor laser from fluctuating so as to output higher harmonic waves at a low noise. In particular, when a DBR semiconductor laser is used, the wavelength can be stably regulated in a wide range so as to be stabilized.

According to the present invention, the operation speed of stabilizing the wavelength can be increased by providing the wavelength variable portion in the semiconductor laser; thus, the present invention is effective in terms of practical use.

Furthermore, in the light wavelength conversion device of the present invention, higher harmonic waves can be taken out of the optical waveguide to stably obtain a light spot without any astigmatism.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for stabilizing an output of higher harmonic waves comprising the steps of:

converting fundamental waves emitted from a distribution Bragg reflection (DBR) semiconductor laser having a wavelength variable portion into higher harmonic waves in a light wavelength conversion device; and controlling a current to be applied to the wavelength variable portion of the DBR semiconductor laser to change an oscillating wavelength of the DBR semiconductor laser, thereby matching the oscillating wavelength with a peak of the higher harmonic waves.

2. A method for stabilizing an output of higher harmonic waves according to claim 1, wherein the wavelength variable portion in the DBR semiconductor laser is positioned on a side far away from the light wavelength conversion device.

3. A method for stabilizing an output of higher harmonic waves comprising the steps of:

converting fundamental waves emitted from a semiconductor laser into higher harmonic waves in a light wavelength conversion device;

applying an optical feed-back to the semiconductor laser to set an oscillating wavelength of the semiconductor laser at a predetermined value; and controlling a drive current of the semiconductor laser to change the oscillating wavelength, thereby matching the oscillating wavelength with a peak of the higher harmonic waves.

4. A method for stabilizing an output of higher harmonic waves comprising the steps of:

converting fundamental waves emitted from a DBR semiconductor laser having first wavelength variable means and second wavelength variable means into higher harmonic waves in a light wavelength conversion device; and coarse-controlling an oscillating wavelength of the DBR semiconductor laser by the first wavelength variable means and fine-controlling the oscillating wavelength by the second wavelength variable means, thereby matching the oscillating wavelength with a peak of the higher harmonic waves.

5. A method for stabilizing an output of higher harmonic waves according to any one of claims 1 or 4, wherein a reflector is further provided between a cleavage face of the semiconductor laser and a DBR portion so that a vertical mode interval is set to be 1 nm or larger.

6. A method for stabilizing an output of higher harmonic waves according to claim 4, wherein the first wavelength variable means in the DBR semiconductor laser is positioned on a side far away from the light wavelength conversion device.

7. A method for stabilizing an output of higher harmonic waves according to any one of claims 1 or 4, wherein the DBR semiconductor laser and the light wavelength conversion device are mounted on a base member, an active layer of the DBR semiconductor laser and an optical waveguide of the light wavelength conversion device are respectively positioned on a side far away from the base member.

8. A method for stabilizing an output of higher harmonic waves comprising the steps of:

converting fundamental waves emitted from a wavelength-locked semiconductor laser into higher harmonic waves in a light wavelength conversion device having an allowable wavelength half value width wider than an oscillating vertical mode interval of the semiconductor laser; and controlling a current to be applied to the semiconductor laser to change an oscillating wavelength of the semiconductor laser, thereby matching the oscillating wavelength with a peak of the higher harmonic waves.

9. A method for stabilizing an output of higher harmonic waves according to any one of claims 1, 3, 4 or 8, wherein the light wavelength conversion device is an optical waveguide type.

10. A method for stabilizing an output of higher harmonic waves according to any one of claims 1, 3, 4 or 8, wherein the optical wavelength conversion device is a bulk type.

11. A method for stabilizing an output of higher harmonic waves according to any one of claims 1, 3, 4 or 8, wherein an output of the fundamental waves is monitored to control the current.

12. A method for stabilizing an output of higher harmonic waves according to claim 2 or 3, wherein the semiconductor laser and the light wavelength conversion device are mounted on a base member, an active layer of the semiconductor laser and an optical waveguide of the optical wavelength conversion device are respectively positioned on a side far away from the base member.

13. A short wavelength laser beam source comprising: a light wavelength conversion device having periodically domain-inverted regions formed in non-linear optical crystal; and a DBR semiconductor laser, wherein the DBR semiconductor laser has a wavelength variable portion, the DBR semiconductor laser comprises means for emitting fundamental waves that are converted into higher harmonic waves in the light wavelength conversion device, and the DBR semiconductor laser has an oscillating wavelength that changes so as to match with a peak of the higher harmonic waves by controlling a current to be applied to the wavelength variable portion of the DBR semiconductor laser, whereby a constant output of the higher harmonic waves is obtained.

14. A short wavelength laser beam source comprising:

a light wavelength conversion device having periodically domain-inverted regions formed in non-linear optical crystal; and a semiconductor laser for emitting fundamental waves that are converted into higher harmonic waves in the light wavelength conversion device, and the semiconductor laser has an oscillating wavelength that is set at a predetermined value by optical feed-back and is changed by controlling a drive current of the semiconductor laser, thereby matching the oscillating wavelength with a peak of the higher harmonic waves to obtain a constant output of the higher harmonic waves.

15. A short wavelength laser beam source comprising: a wavelength-locked semiconductor laser; and a light wavelength conversion device having an allowable wavelength half value width wider than an oscillating vertical mode interval of the semiconductor laser, wherein fundamental waves emitted from the semiconductor laser are converted into higher harmonic waves in the light wavelength conversion device, and an oscillating wavelength of the semiconductor laser is changed by controlling a current to be applied to the semiconductor laser so as to match with a peak of the higher harmonic waves, whereby a constant output of the higher harmonic waves is obtained.

16. A short wavelength laser beam source according to any one of claims 14 or 15, wherein the semiconductor laser and the light wavelength conversion device are mounted on a base member, an active layer of the semiconductor laser and an optical waveguide of the light wavelength conversion device are respectively positioned on a side far away from the base member.

17. A short wavelength laser beam source comprising: a light wavelength conversion device having periodically domain-inverted regions formed in non-linear optical crystal; and a DBR semiconductor laser having a wavelength variable portion, wherein a reflector is provided outside the DBR semiconductor laser and a laser oscillation is generated between the reflector and the DBR semiconductor laser, the DBR semiconductor laser has means for emitting fundamental waves that are converted into higher harmonic waves in the light wavelength conversion device, and the DBR semiconductor laser has an oscillating wavelength that is changed by controlling a current to be applied to the wavelength variable portion of the semiconductor laser so as to match the oscillating wavelength with a peak of the higher harmonic waves, whereby a constant output of the higher harmonic waves is obtained.

18. A short wavelength laser beam source according to any one of claims 13, 14, 15 or 17, wherein the light wavelength conversion device is an optical waveguide type.

19. A short wavelength laser beam source according to claim 18, wherein the optical waveguide is a proton-exchanged optical waveguide.

20. A short wavelength laser beam source according to any one of claims 13, 14, 15 or 17, wherein the light wavelength conversion device is a bulk type.

21. A short wavelength laser beam source according to any one of claims 13, 14, 15 or 17, wherein the non-linear optical crystal is $LiNb_xTa_{1-x}O_3$ ($0 \leq X \leq 1$).

22. A short wavelength laser beam source according to any one of claims 13, 14, 15 or 17, further comprising a detector and a beam splitter.

23. A short wavelength laser beam source according to any one of claims 13, 14, 15 or 17, wherein an output of the fundamental waves is monitored to control the current.

24. A short wavelength laser beam source according to any one of claims 13 or 17, wherein a reflector is further provided between a cleavage face of the semiconductor laser and a DBR portion so that a vertical mode interval is set to be 1 nm or larger.

25. A short wavelength laser beam source according to claim 17, wherein a reflector is further provided on either of an incident face or an output face of the light wavelength conversion device.

26. A short wavelength laser beam source according to any one of claims 13, 14, 15 or 17, wherein reflected return light of the fundamental waves in the light wavelength device is 0.2% or less.

27. A short wavelength laser beam source according to any one of claims 13 or 17, wherein the DBR semiconductor laser is RF-driven.

28. A short wavelength laser beam source according to any one of claims 13 or 17, wherein temperature of the semiconductor laser is controlled on a first face of a Peltier device, temperature of the light wavelength conversion device is controlled on a second face of the Peltier device, and change in temperature of the first face is opposite to change in temperature of the second face.

29. A short wavelength laser beam source according to any one of claims 13, 14, 15 or 17, wherein a wavelength of the fundamental waves is shifted from a phase-matched wavelength of the light wavelength conversion device to modulate an output of the higher harmonic waves.

30. A short wavelength laser beam source according to any one of claims 13, 14, 15 or 17, wherein a wavelength of the fundamental waves is matched with a phase-matched wavelength of the light wavelength conversion device, and thereafter, a drive current of the semiconductor laser is regulated so as to regulate the output of the higher harmonic waves.

31. A short wavelength laser beam source according to claim 13 or 17, wherein the wavelength variable portion in the DBR semiconductor laser is positioned on a side far away from the light wavelength conversion device.

32. A short wavelength laser beam source according to any one of claims 13 or 17, wherein the DBR semiconductor laser and the light wavelength conversion device are mounted on a base member, an active layer of the DBR semiconductor laser and an optical waveguide of the light wavelength conversion device are respectively positioned on a side far away from the base member.

\* \* \* \* \*

UNITED STATES PATENT AND TRADE MARK OFFICE
CERTIFICATE OF CORRECTION

PATENT NO.   : 5,936,985
DATED        : August 10, 1999
INVENTOR(S)  : Yamamoto et al.

It is certified that error appears in the above-identified patent and that said Letters Patent is hereby corrected as shown below:

Column 30, line 15, "2 or 3" should read --3 or 8--.

Signed and Sealed this

Ninth Day of May, 2000

Attest:

Q. TODD DICKINSON

Attesting Officer

Director of Patents and Trademarks